(12) United States Patent
Shemesh

(10) Patent No.: US 7,271,396 B2
(45) Date of Patent: Sep. 18, 2007

(54) METHOD AND DEVICE FOR ALIGNING A CHARGED PARTICLE BEAM COLUMN

(75) Inventor: Dror Shemesh, Rehovot (IL)

(73) Assignee: Applied Materials, Israel Limited, Rehovot (IL)

( * ) Notice: Subject to any disclaimer, the term of this patent is extended or adjusted under 35 U.S.C. 154(b) by 31 days.

(21) Appl. No.: 10/492,574

(22) PCT Filed: Oct. 4, 2002

(86) PCT No.: PCT/IB02/05119

§ 371 (c)(1),
(2), (4) Date: Sep. 10, 2004

(87) PCT Pub. No.: WO03/032359

PCT Pub. Date: Apr. 17, 2003

(65) Prior Publication Data

US 2005/0012050 A1 Jan. 20, 2005

(30) Foreign Application Priority Data

Jul. 29, 2002 (EP) .................................. 02016838

(51) Int. Cl.
*H01J 37/26* (2006.01)
(52) U.S. Cl. ................ 250/396 R; 250/310; 250/491.1
(58) Field of Classification Search ................ 250/398, 250/396 R, 310, 491.1
See application file for complete search history.

(56) References Cited

U.S. PATENT DOCUMENTS

| | | | |
|---|---|---|---|
| 4,423,305 A * | 12/1983 | Pfeiffer .................. | 219/121.28 |
| 4,451,737 A * | 5/1984 | Isakozawa .................. | 250/311 |
| 4,618,766 A | 10/1986 | Van der Mast et al. | |
| 5,258,617 A | 11/1993 | Kaneyama et al. | |
| 5,359,197 A | 10/1994 | Komatsu et al. | |
| 5,414,261 A * | 5/1995 | Ellisman et al. ............ | 250/311 |
| 5,502,306 A * | 3/1996 | Meisburger et al. ........ | 250/310 |
| 5,578,821 A * | 11/1996 | Meisberger et al. ........ | 250/310 |
| 5,627,373 A | 5/1997 | Keese | |

(Continued)

FOREIGN PATENT DOCUMENTS

EP 1 202 320 A2 5/2002

(Continued)

OTHER PUBLICATIONS

PCT Search Report; International Application No. PCT/IB/02/05119 dated Nov. 30, 2004.

(Continued)

*Primary Examiner*—Robert Kim
*Assistant Examiner*—Johnnie L Smith, II
(74) *Attorney, Agent, or Firm*—Patterson & Sheridan, LLP

(57) ABSTRACT

The invention provides a method for automatically aligning a beam of charged particles with an aperture. Thereby, the beam is defelcted to two edges of the aperture. From the signals required to obtain an extinction, a correction deflection field is calculated. Furter, a method for automatically aligning a beam of charged particles with an optical axis is provided. Thereby a defocusing is introduced and a signal calculated based on an introduced image shift is applied to a deflection unit. Further, a method for correction of the astigmatism is provided. Thereby the sharpness is evaluated for a sequence of frames measured whilst varying the signals to a stigmator.

59 Claims, 12 Drawing Sheets

U.S. PATENT DOCUMENTS

| | | | |
|---|---|---|---|
| 6,067,164 A * | 5/2000 | Onoguchi et al. | 356/401 |
| 2004/0264764 A1* | 12/2004 | Kochi et al. | 382/154 |
| 2005/0006598 A1* | 1/2005 | Pearl | 250/492.1 |
| 2005/0061972 A1* | 3/2005 | Kochi et al. | 250/310 |
| 2005/0133718 A1* | 6/2005 | Miyamoto et al. | 250/307 |

FOREIGN PATENT DOCUMENTS

| | | |
|---|---|---|
| EP | 1 302 971 A2 | 4/2003 |
| JP | 61-004140 | 1/1986 |
| JP | 61-294745 | 12/1986 |
| JP | 02-234336 | 9/1990 |
| JP | 03-194839 | 8/1991 |
| JP | 05-266840 | 10/1993 |
| JP | 10-269975 | 10/1998 |
| JP | 2000-048749 | 2/2000 |

OTHER PUBLICATIONS

Japanese Office Action (Patent Application No. P2003-535230, Dated Nov. 11, 2005).

European Search Report for EP Application No. 02016838.1-2208, filed Mar. 6, 2006.

* cited by examiner

METHOD AND DEVICE FOR ALIGNING A CHARGED PARTICLE BEAM COLUMN

FIELD OF THE INVENTION

The present invention generally relates to charged particle columns and more particularly to a method and an apparatus for alignment and correction of aberrations of a beam of charged particles. More specifically, the present invention also relates to an automatic alignment of a beam of charged particles and automatic correction of aberrations.

BACKGROUND OF THE INVENTION

Technologies like microelectronics, micromechanics and biotechnology have created a high demand in industry for structuring and probing specimens within the nanometer scale. On such a small scale, probing or structuring is often done with electron beams, which are generated and focussed in charged particle beam devices like electron microscopes or electron beam pattern generators. Charged Particle beams offer superior spatial resolution compared to e.g. photon beams due to their short wavelengths.

The spatial resolutions that could possibly be achieved based on wavelength e.g. below 0.01 nm is, however, limited due to intrinsic aberrations and misalignments of the beam of charged particles leading to a decrease of resolution.

For example, in a scanning electron microscope (SEM) the beam is focused to a small spot having a size around 1.5 nm or smaller. The beam is scanned over a specimen. Thereby, the resolution of the images obtained is limited by the beam diameter in the plane of the sample surface.

The beam diameter can be limited by aberrations, for example chromatic aberrations that are independent of the alignment of the beam but depend on the energy variance of the electron beam. Further, there are spherical aberrations that are produced by non-zero apertures of the imaging lenses. However, aberrations can be made worse or can even be introduced by a misalignment of the beam with respect to the optical axis of the individual imaging element. Since the high spatial resolutions also require very small tolerances, alignment of the beam with respect to individual optical elements has to be conducted on a regular basis.

Conventionally an alignment of a charged particle column has to be performed by an operator. Thereby, an operator adjusts the respective signals applied to an alignment correction devices based on images measured. One disadvantage of this procedure is that it is dependent on the judgment of the operator. Thus, inaccuracies and variations from one operator to the other are introduced. Further, the manually adjustments are time consuming which is particularly disadvantageous for online inspection systems requiring a high system throughput.

In documents U.S. Pat. No. 5,627,373 a method for automatically aligning an electron beam axis to an objective lens axis in a scanning electron microscope is described. Thereby, an image of a specimen at a first and at a second point of focal range of the objective lens is measured. For each image an indication signal of a position of a straight edge within the field of view of the microscope is generated. After an image translation is detected from the two signals and alignment is automatically adjusted, the procedure is repeated in an orthogonal direction. The complete operating sequence is repeated in iterations until the image shift occurring due to the misalignment is less than a predetermined threshold.

Further, a method for automatically correcting electron beam astigmatism in a scanning electron microscope is suggested in document U.S. Pat. No. 5,627,373. For astigmatism correction, border portions are sampled about the entire specimen circumference at a 30° interval. An axis of beam distortion is identified upon the indication signals of sharpness among the samples. The distortion is adjusted along such axis and improved in iterations.

Document U.S. Pat. No. 6,025,600 teaches a method for calculating and correcting an astigmatism error in charged particle beam systems. Images are collected during a single sweep of the objective lens settings of the charged particle system. Different orientations of image features, such as lines in a stigmation target, are analyzed. Best-sharpness or best focus values are obtained as a function of the objective lens settings. Appropriate changes to the settings of the astigmatism correctors are computed by taking a linear combination of best sharpness values associated with the different orientations of image features.

In document U.S. Pat. No. 6,067,167 a scheme for realizing the automatic adjustment of the electron optics system in an electron optics device such as scanning electron microscope, in which a prescribed number of images sequentially obtained by the electron optics device at sequentially adjusted focus points due to a changing refractive index of an objective lens are stored. A moving amount of a sample image is calculated. Thereby, a judgment of whether an adjustment is necessary or not is based on the calculated moving amount and an adjustment is conducted if needed. Further, a scheme for realizing the astigmatism correction in a charged particle beam optical system of an electron optics device such as scanning electron microscope is disclosed.

However, there are further problems related to the alignment of a charged particle beam column and the improvements presented within the prior art needs further perfectioning especially when online inspection systems or online beam writers are considered.

SUMMARY OF THE INVENTION

The present invention intends to overcome the above problems. According to some aspects of the present invention a method for automatically aligning a beam of charged particles with an aperture according to independent claim 1, a charged particle beam device according to claim 17, an improved method for automatically aligning a beam of charged particles to an optical axis of a charged particle column according to independent claim 21, a charged particle beam device according to claim 42, an improved method for correcting the astigmatism of a beam of charged particles according to independent claims 46 and 58, a charged particle beam device according to claim 69 and a method for automatically aligning a beam of charged particles of a charged particle beam device according to independent claim 72 is provided.

Further advantages, features, aspects and details of the invention are evident from the dependent claims, the description and the accompanying drawings.

According to the present invention, it is advantageous to vary the energy of the charged particle beam to decrease the time necessary for an alignment. Further, it is advantageous to automate more necessary alignment steps and additionally realize further improvements.

Thus, the following drawbacks related to the prior art can be overcome For example, within the prior art, iterative adjustments of respective misalignments are suggested.

Thereby, even for an automated adjustment of a beam of charged particles, the behavior of an operator adjusting the system is imitated. This imitation of the iterative procedure of an operator might improve alignment times to some degree, but the time necessary to adjust a charge particle system will still be in the range of 5 to 10 seconds. This is especially true, since in the prior art it is taught to vary the focus by changing the current of the objective lens. The objective lens, however, is often built in the form of a magnetic or magnetic-electrostatic lens. Thus, the self-inductance of the coils inhibit a fast variation of the focus and, thereby, delimits a further improvement of the time necessary for the adjustment of the beam of charged particles.

In addition, within the prior art, the automation of aligning a charged particle column is only realized in parts. Thus, only individual alignment steps can be performed automatically and an operator is more likely to be necessary as if a complete alignment of the entire column would be automatically realized. For this reason, especially in online measuring systems, an operator will still be necessary, even though his responsibility or his necessary skills might be reduced.

The present invention generally relates to a charged particle column, and more particularly to a method and an apparatus for alignment and correction of aberrations of a beam of charged particles. More specifically, the present invention also relates to an automatic alignment of a beam of charged particles and automatic correction of aberrations.

According to a further aspect of the present invention, there is provided a method for aligning a beam of charged particles emitted by a charged particle gun to an aperture. Thereby, the beam is deflected as to be blanked by an aperture on a first edge of the aperture and a first deflection signal required to obtain an extinction, is measured. Additionally, the beam is deflected as to be blanked by the aperture on a second edge of the aperture and a second deflection signal required to obtain a further extinction is measured. From the first and second deflection signal, a signal corresponding to the center position of the aperture is calculated and provided in order to align the beam. Within this application, this alignment method is also referred to as gun alignment.

Thus, in case the basic adjustment of the charged particle beam column is insufficient to activate an alignment of the beam of charged particles to the optical axis, there is less necessity for an operator to get engaged. Due to the alignment described above, a poor alignment of the beam of charged particles can automatically be improved to a degree that a further alignment of the beam, leading to a high accuracy, can be started without the intervention of an operator. Further, the above-mentioned advantages concerning an automated alignment over the alignment by an operator also apply to this inventive method.

Within this application the phrase "charged particle beam column" refers to all kind of devices wherein a beam of charged particles has to be aligned. This could be an electron microscope, an electron beam writer or corresponding devices using ions. An aperture as referred to within this application can be a beam defining aperture or an aperture incorporated to separate different vacuum chambers. Preferably, however the phrase aperture refers to the final aperture of a charged particle beam column. If not mentioned otherwise e.g. in a specific embodiment, beam deflection fields and beam deflection units are understood to be electrostatic, magnetic or magnet-electrostatic. Such units could be realized in the form of biased plates, coils or a combination thereof. Measurements of scattered or secondary corpuscles from a specimen can be conducted with detectors in the form of scintillators connected to photomultiplier tubes or the like. Since the way of measuring the signals does not influence the inventive idea in general, this is not to be understood as limiting the invention.

Preferable details and advantages of the gun alignment will be described in the following.

Making use of the aspect according to the invention as described above, it is preferred to vary the respective deflection fields and simultaneously measure successive images, preferably in the form of frames. The gray levels of the frames generated are calculated. Dependent on the gray levels the signals required to obtain an extension are measured. More preferably, the signals required to deflect the beam of charged particles from a position where it is not blanked by the aperture to a position where it is blanked by the aperture is measured by either using a threshold for the gray levels or by using a curve fit to a gray level graph. Thus, the first and second signal can be gained in an automated, efficient and accurate manner.

Within this application the word frame is used as a single scanning of the field of view of the charged particle beam device. Thereby, an image is obtained. An image, in general however, can be obtained by e.g. averaging more than one frame. In addition, filter functions or the like can be applied to obtain the final image.

In case successive frames, that is a sequence of frames, are grabbed (imaged) or generated while varying the deflection signal applied to the deflection unit, it is preferable to apply the signal in a manner to obtain deflection fields in form of a ramp and the frames are measured during one ramp cycle. More preferable the ramp, that is to say the variation of the signals or fields having the form of the ramp, is synchronized with the imaging of the frames. Thus, it is possible and even more preferred to repeat the measurement and to average images, which correspond to each other.

Within this application a ramp function is to be understood as a monotonous function that has preferably a well-defined slope. It is to be understood that this also could be a step-like function, having preferably a well-defined height and length of the steps.

The aspects of gun alignment, as already described, should, according to the invention, be automated. Thus, different possible events have to be reacted on and/or controlled by a process control unit, e.g. comprising a CPU. For this reason, it is, according to the present invention, preferred if as a first step a deflection signal is provided such that the aperture does not blank the beam of charged particles. This will ease the flow charts of the process control which, more preferably, will send an error notification if the beam would not pass through the aperture initially. Such an error notification could e.g. be used to stop the further method flow or to simply inform an operator of the current alignment status of the charged particle device.

It is further preferred to realize the above method in an additional second direction. This second direction should more preferably being orthogonal to the first direction.

According to a further aspect of the present invention, there is provided a method for automatically aligning a beam of charged particles to an optical axis of a charged particle column. Thereby, the energy of the beam is changed. The defocusing introduced thereby, feeds, in case of a misalignment, an image translation. The image translation is measured and evaluated. Therefrom, a correction signal to align the beam of charged particles to an optical axis is deduced and provided to a deflection unit. Within this application this alignment method is also referred to as aperture alignment.

Within this application, changing the energy of the beam of charged particles includes all changes of potentials within the charged particle beam column that influence the charged velocity within the objective lens. Thus, an accelerating voltage within the gun could be varied by changing any other potential, such as specimen potential. Any other voltage or current modification, that affect the focusing properties of the objective lens in a way that can be related to a column misalignment, can be used as well. In the present application, the variation in the energy and thereby, defocusing is conducted periodically. This periodical change of the energy of the beam is, within this application, also referred to as "wobble" or wobbling similar to the phrase used for a periodical defocusing making use of a lens current as known from the operator-supported alignment. The fact that the variation in the energy and, thereby, defocusing is conducted periodically is only rue to the limitation of existing electronic driver (Wobble sinusoidal generator). Preferably, assuming a modern electronic setup, the energy change is conducted as a single linear ramp.

Further, it is to be understood that within this application the phrase "evaluate" also refers to calculations of an algorithm, which is e.g. used by a computer.

Making use of this aperture alignment, as described above, advantages can be achieved. Since specifically devices being operated in a production line require a high availability and a high long-term accuracy, it is important to provide a fast alignment process. Since in the described method there is no need to vary the current in an objective lens, no self-inductance is induced within the coil of an objective lens, which would slow down the possible frequency for periodical modifications of the focus. Thus, the alignment process can be speeded up and, thereby, the availability is increased or an alignment can be performed on a more regular basis to improve the long-term accuracy.

In addition, the variation of the refraction index of a magnetic or magnetic-electrostatic objective lens by changing the lens current introduces a hysteresis. For this reason, it is necessary to partly compensate for this hysteresis by adding calculated correcting values to the current applied or the alignment process is further slowed by current control techniques trying to avoid this hysteresis. Thus, changing the energy of the beam can for this further reason be considered advantageous.

It is preferred for the aperture alignment to measure a golden template as a reference. In contrast to the measurements conducted during image translation (while the energy is being modified), the golden image is generated while the energy is kept constant. By averaging several consecutive frames, the golden image exhibits a high signal to noise ratio. An image-processing module "pattern analyzer" can analyze this image and search for a small image area showing strong edge information in horizontal and vertical directions. These selected areas are referred to as a golden template. They are used as reference during the pattern recognition process.

In contrast thereto, for the measurement of the image shift, namely the translation of the image due to a misalignment, it is preferred to have a fast image sequence. It is preferred to measure single frames and calculate a quasi-continuous shift of these images (frames). Due to this, it is possible to only have small translations of the image from one frame to the next frame. Thus, it is easier and more accurate to follow the image shifts between two successive frames. Thereby, it is preferred to have an image shift between two successive images of less than 20 pixels, it is more preferred to have an image shift between two successive images of less than 10 pixels and even more preferred to have an image shift of less than 5 pixels.

It is further preferred to compare the respective features of the sequence of frames, measured to obtain the image shift, to the golden template. The image shift is preferably measured using pattern tracking. More preferably, recursive pattern recognition is used. Thereby, it is preferred to select from the frames measured successively an initial frame that has features that are closest to the golden template. Due to the initial frame, advantage can be taken from the fact that a synchronization of the time between two frames is usually better than the synchronization of starting the measurement and starting wobbling. Further, the respective features used for measuring the image shift can be found more precisely and with a higher certainty, since, especially for the recursive pattern recognition, only small deviations from the preceding image can occur. This is particularly important, since the periodical defocusing of the beam of charged particles also leads to a blurring of the image. Thus, the more the image is defocused, the more difficult it gets to have a pattern recognition automatically detect selected features of an image. These difficulties can be compensated for by the preferred aspects mentioned above.

It is preferred that from the image shifts of the consecutive images, a frame position vector is calculated. The frame index can be directly translated in the time domain giving a vector of the frames position versus time. The variation conducted in the energy and the frame position vector are directly related (synchronized). Thus, a function based on the periodic behavior of the energy variation can be fitted to the frame position vector. The results of the fitting procedure give the amplitudes parameters of the image shift and are translated in correction values for the beam deflection unit.

It is preferred to calculate the signal that has to be applied to the deflection units based on a calibration. This calibration gives a function for the signal to be applied dependent on the image shift detected. Such a calibration can be conducted once during manufacturing of the charged particle column but could also be repeated on a regular basis.

In view of the above aspects and details, it is possible to improve the ratio of measuring speed and measuring accuracy. Thus, it is possible to achieve the same accuracy within a shorter time. It is preferred to perform the alignment, referred to as aperture alignment, faster than 3 s, preferably faster than 1 s and more preferably faster than 0.5 s. Thus, the alignment time, namely the total procedure time, can be reduced and, thereby, the availability of the device can be improved.

Due to the fact that a calibration for the required signal on the beam shift can be used, an iteration is in general not inevitable required. Even though such a calibration is more efficient than having a purely iterative adjustment of the beam of charged particles with respect to the optical axis, it might be preferred that the alignment is repeated in at least one iteration to improve the accuracy of the alignment.

Further it is preferred to perform the alignment in a second direction. More preferably the second direction is roughly orthogonal to the first alignment direction.

It is further preferred to calibrate different instrument setups. Thus, an alignment can be achieved independent of the device parameters in use.

According to a further aspect of the present invention, there is provided a method for correcting the astigmatism of a charged particle beam apparatus. The energy of a beam of charged particles is changed to automatically focus the beam on a specimen. Further, while changing the current in a stigmator, frames are imaged. The sharpness of the imaged frames are evaluated and the stigmator is set to a current corresponding to the sharpest image.

Making use of this, advantages can be achieved. Since especially devices being operated in a production line require a high availability and a high long-term accuracy, it is important to provide a fast alignment process. Since in the described method there is no need to vary the current in an objective lens, no self-inductance is induced within the coil of an objective lens, which would slow down the possible frequency for periodical modifications of the focus. Thus, the alignment process can be speeded up and, thereby, the availability is increased or an alignment can be performed on a more regular basis to improve the long-term accuracy.

In addition, the variation of the refraction index of a magnetic or magnetic-electrostatic objective lens by changing the lens current introduces a hysteresis. For this reason, it is necessary to partly compensate for this hysteresis by adding calculated correcting values to the current applied or the alignment process is further slowed by current control techniques trying to avoid this hysteresis. Thus, changing the energy of the beam periodically can for this further reason be considered advantageous.

It is preferred to repeat the steps of changing the current and evaluating the sharpness of the imaged frames for a second stigmator. The two stigmators, each preferably for one direction a quadrupole arrangement, will, thus, more preferably form an octupole, if the two directions are rotated by 45° with respect to each other.

It is preferred if the current applied to a stigmator is varied in form of a ramp. Thereby, a synchronization of a frame number and the current applied while imaging the respective frame can more easily be achieved.

Using the above method, the variation of the stigmator currents will in addition lead to a translation of the image. In general, two different principles of evaluating the sharpness of an image have to be differentiated between. Commonly, individual features are chosen from the image and the sharpness of the image is evaluated based on the sharpness of these features. The above-mentioned translation of the image will, however, also shift the respective features that are to be analyzed. In case this shift of the features is not taken into account, a misjudgment of the image sharpness will most likely occur. Therefore, preferably the sharpness of a frame or an image respectively is determined using a focus histogram. Thereby, individual features are not analyzed but the entire image or parts of the image. Thus, there is no need to correct the focus marks with respect to the image shift introduced. More preferably a two-ramp focus analysis is used for evaluating the sharpness of the images. Thereby, at least two images measured under similar conditions are compared to each other and the sharpness is based on this comparison. Thereby, it is preferred to calculate the covariance of the respective frame. These at least two frames are preferably measured during two separate ramp cycles. More preferably, the ramp has a step-like form and the at least two images are measured during one ramp cycle. Making use of these aspects, in general, features can be evaluated with respect to the sharpness of the image, without the necessity to take into account the translation of the image.

In case an even better accuracy is required or the above method to avoid the influence of the image shift cannot be applied, preferably the image shifts introduced due to the variation of the stigmator currents can be detected using pattern recognition and can preferably be corrected for.

The preferred aspects and details mentioned above with respect to the method for correcting the astigmatism of an imaging system can also be applied for the further two aspects according to the present invention relating to astigmation correction that are described in the following.

According to a further aspect of the present invention, there is provided a method for correcting the astigmatism of a beam of charged particles, comprising the steps of imaging a sequence of frames while varying the current in a first group of stigmation coils and evaluating the sharpness of the successive frames to find the current associated with the sharpest image and setting the current of the first group of stigmation coils to the current associated with the sharpest image, whereby the sharpness is evaluated using a focus histogram. Thereby, it is in analogy with the first astigmatism correction method preferable to first focus the beam of charged particles on the surface of the specimen.

According to an even further aspect of the present invention, there is provided a method for correcting the astigmatism of a beam of charged particles, comprising the steps of imaging a sequence of frames while varying the current in a first group of stigmation coils and evaluating the sharpness of the successive frames to find the current associated with the sharpest image and setting the current of the first group of stigmation coils to the current associated with the sharpest image, whereby the sharpness is evaluated using a two ramp focus analysis. Thereby, it is in analogy with the first astigmatism correction method preferable to first focus the beam of charged particles on the surface of the specimen.

According to a further aspect of the present invention, there is provided a method for automatically aligning a beam of charged particles within a charged particle device. Thereby, the beam is so deflected as to be blank by an aperture at a first edge of the aperture and a first deflection signal required to obtain an extinction, is measured. Additionally, the beam is deflected as to be blanked by the aperture at a second edge of the aperture and a second deflection signal required to obtain a further extinction is measured. From the first and second deflection signal, a signal corresponding to the center position of the aperture is calculated and provided to align the beam. Further, the focus with respect to a specimen surface is periodically changed. This defocusing feeds, in case of a misalignment, an image translation. The image translation is measured and evaluated. Therefrom, a correction signal to align the beam of charged particles to an optical axis is deduced and provided to a deflection unit. Further, while changing the current in a stigmator, frames are imaged. The sharpness of the imaged frames is evaluated and the stigmator is set to a current corresponding to the sharpest image.

Making use of this method for automatically aligning a beam of charged particles within a charged particle device, a charged particle column can be aligned, in spite of a poor alignment to start with, without depending on the judgment of an operator. This can be done with improved speed and, thus, the availability of the device can be improved.

Further, all advantageous features and inventive details that are described above with respect to the aspects of gun alignment, aperture alignment and astigmatism correction can individually or in combination be applied to the fully automated column alignment.

The invention is also directed to apparatus for carrying out the disclosed methods and including apparatus parts for performing each described method steps. These method steps may be performed by way of hardware components, a computer programmed by appropriate software, by any combination of the two or in any other manner. Furthermore, the invention is also directed to methods by which the described apparatus operates. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Initially, it should be appreciated by those skilled in the art that the present invention can be used with any charged particle device. However for convenience, the invention will be described with respect to its implementation in a scanning electron microscope (SEM). Those skilled in the art would also appreciate that all discussions herein related to voltages and potentials refer to relative and not absolute terms. For example, accelerating the beam by connecting the cathode to "ground" and applying 3 kV to the sample is equivalent to applying negative 3 kV to the cathode and placing the specimen on ground. Therefore, while for convenience some discussion is provided in terms of specific voltages, it should be understood that the reference is to relative potential.

Figure 1:
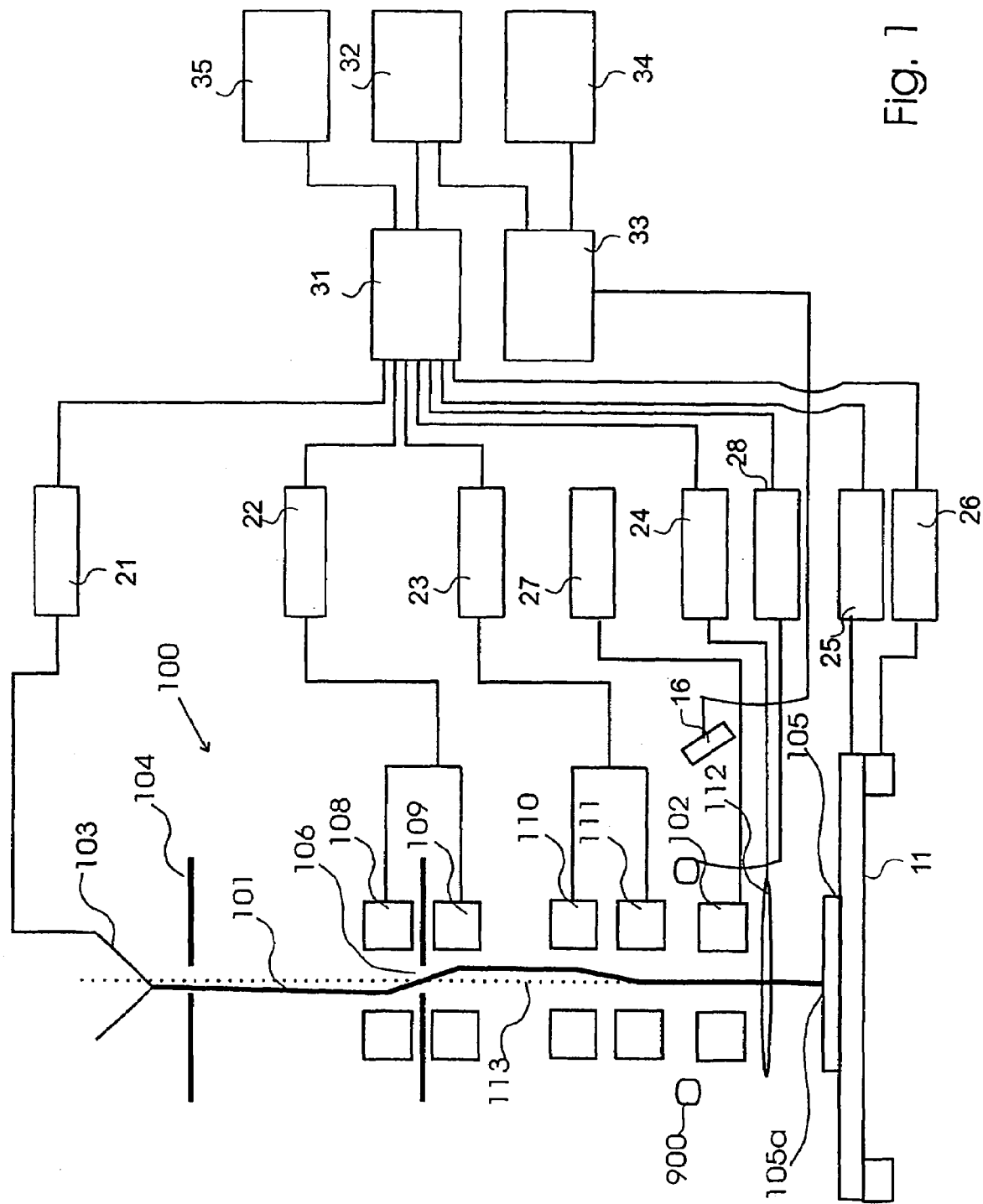
FIG. 1 shows a block diagram of a charged particle beam device suitably to conduct the various aspects of the present invention.

A block diagram of an electron microscope is shown schematically in FIG. 1. The electron microscope 100 comprises an electron gun 103 emitting an electron beam 101, which is extracted by the anode 104. The objective lens 112 focuses the electron beam on the specimen surface 105a In order to obtain an image from the entire field of view, the beam is scanned over the specimen using the scanning deflection unit 102. An alignment of the beam to the aperture 106 or the optical axis 113 respectively can be achieved by the deflection units 108 to 111. As a deflection unit either coils, electrostatic modules in the form of charged plates or a combination of coils and electrostatic deflectors can be used. An image is formed within a scanning electron microscope (SEM) by detecting backscattered or secondary electrons with a detector 16 and synchronizing the detected signal with the scanning of the electron beam.

A secondary product of major importance to examination or the image formation of specimens, are secondary electrons that escape from the specimen 105 at a variety of angles with relatively low energy (3 to 50 eV). These secondary electrons reach the detector 16 and are detected. By scanning the electron beam 101 over the specimen 105 and displaying/recording the output of the detector 16 an image of the surface of the specimen 105a is formed.

The different parts of the apparatus are connected to corresponding supply units, the high voltage supply unit 21, the gun alignment deflection control unit 22, the aperture alignment deflection control unit 23, the scanning coil supply unit 27, the objective lens supply unit 24, the stigmator control (and current supply) unit 28, the specimen voltage supply unit 25 and the stage supply unit 26, which are controlled by the parameter adjustment unit 31. The parameter adjustment unit 31 is connected with the standard setting unit 35 and the analyzing and/or synchronization control unit 32, which provides a basic set of parameters to the parameter adjustment unit 31.

Figure 2A:
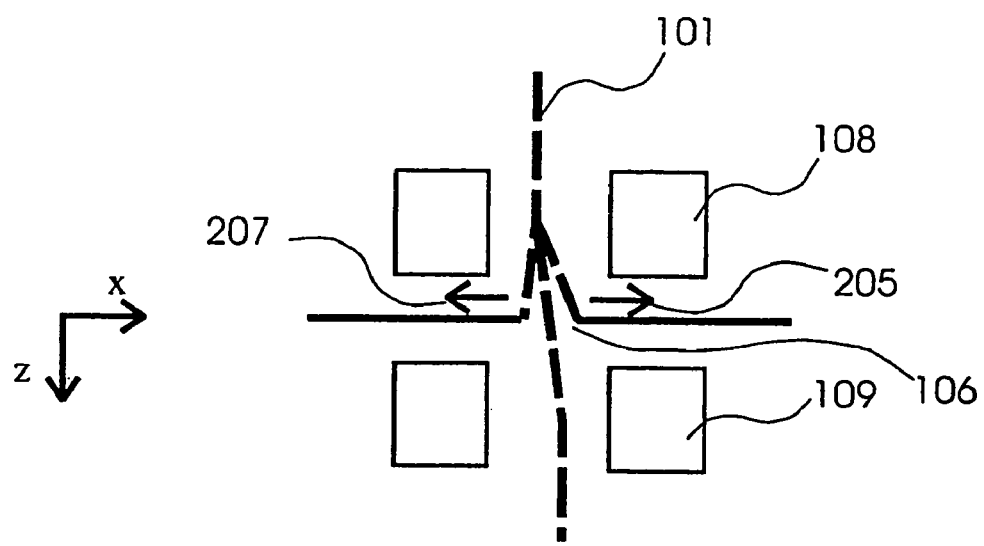
FIG. 2a shows a block diagram illustrating the principle of gun alignment.
Figure 2B:
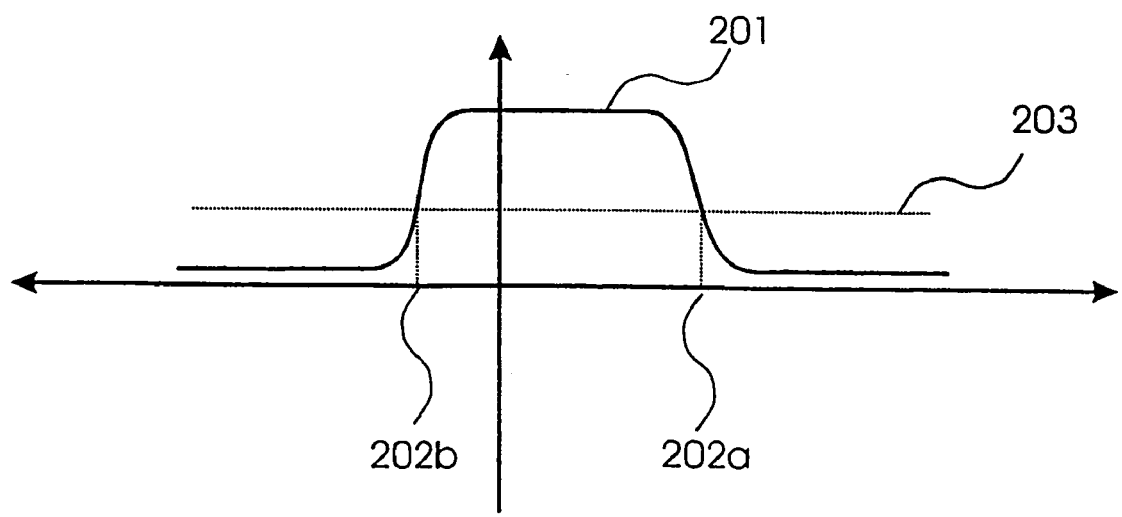
FIG. 2b shows a gun alignment graph, namely the gray levels as a function of the beam deflection.

FIGS. 2a and 2b illustrate the aspect of gun alignment according to an embodiment of the present invention. The gun alignment is a test and adjustment of the symmetry of the electron beam with respect to the aperture 106. Thereby, the electron beam 101 is aligned with the aperture 106. That is to say, the electron beam 101 is aligned such that it passes through the center of the aperture. This alignment comprises the following steps. The first gun alignment deflection unit 108 is driven to deflect the beam towards direction 205. In case the electron beam passes though the aperture, a specimen will be irradiated with the beam and secondary or backscattered signals can be imaged. Thus, a bright image can be seen. The first gun alignment deflection unit is driven to deflect the beam further until there is an extinction of the beam at the edge of the aperture. Thereby, brightness of the image will decrease. Thus, if the gray level of an image is shown as a function of the beam deflection or the deflection field strength respectively for deflection signal 202a the gray level will fall below a threshold 203. This respective signal for the first gun alignment deflection unit will be e.g. memorized as a first signal. This procedure is repeated in the opposite direction 207. Thereby, there will be an extinction of the electron beam on the other edge of the aperture and for a deflection signal 202b the gray level will again fall below a threshold, whereby a second signal is obtained. From the two signals, the beam shift required to guide the electron beam 101 through the center of the aperture 106 is calculated and applied to first gun alignment deflection unit 108. The center in the above (one-dimensional) context is, since an alignment in x-direction is described, to be understood as the middle of a projection of the aperture in the x-z-plane.

However, the present invention is to be understood with respect to an aperture as a two-dimensional object. Thus, it is advantageous that the alignment described above is conducted in a second direction. Aligning both directions, x and y, the electron beam is aligned to the center of the aperture. This second direction should at least differ from the first direction. The second direction is preferably orthogonal to the first direction. Thus, the gun alignment method described above in x-direction is preferably repeated also in y-direction. Therefore, the center in x- and y-direction of an e.g.

circular aperture can be found. The aperture is preferably a circle. For the alignment in y-direction a third and fourth gun alignment deflection are advantageously located such that a corresponding deflection in a second direction can be realized.

First gun alignment deflection unit 108, however, does not shift the beam towards the center position of aperture 106, but deflects the beam whereby a beam tilt is introduced. That is to say, the angel of the beam with respect to e.g. an optical axis changes due to the deflection. This beam deflection is, at least partially, compensated for by the second gun alignment deflection unit 109. Preferably, second gun alignment deflection unit 109 tilts the beam at the same angle as the first gun alignment deflection unit in the opposite direction. This can e.g. be realized by having two similar deflection units and connect them electrically in a manner that the deflection fields with the same absolute value have the opposite direction. However, the present invention is not limited to similar first and second gun alignment deflection units 108, 109. Differences in deflection angles for identical signals applied to the deflection units could also be equalized by correction factors or the like.

In general, the above-described facts relating to beam shift apply for all aspects, alignment methods and embodiments making use of deflection units within the present invention. That is to say, when a beam of charged particles is deflected in a single deflection unit the beam is additionally tilted. Thereby, two degrees of freedom influencing the alignment of a charged particle beam are coupled to each other. Due to this coupling the alignment of the beam is complicated. To avoid this, it is preferred to use a second deflection unit to redirect the beam towards its original direction. Thus, redirecting should be understood as reestablishing (after the second deflection unit) substantially the direction of the charged particle beam before the first deflection unit. It is even more preferred to redirect the beam in a manner to propagate along its original direction.

The fact that this procedure is supposed to be automatic brings the necessity for an advanced status notification handling. Since the start conditions of the alignment can not be exactly determined, a flow chart as shown in FIG. 4 should include all possible situations that could occur during the automated system. Some of the possible measuring situations are shown in FIG. 3.

Figure 3:
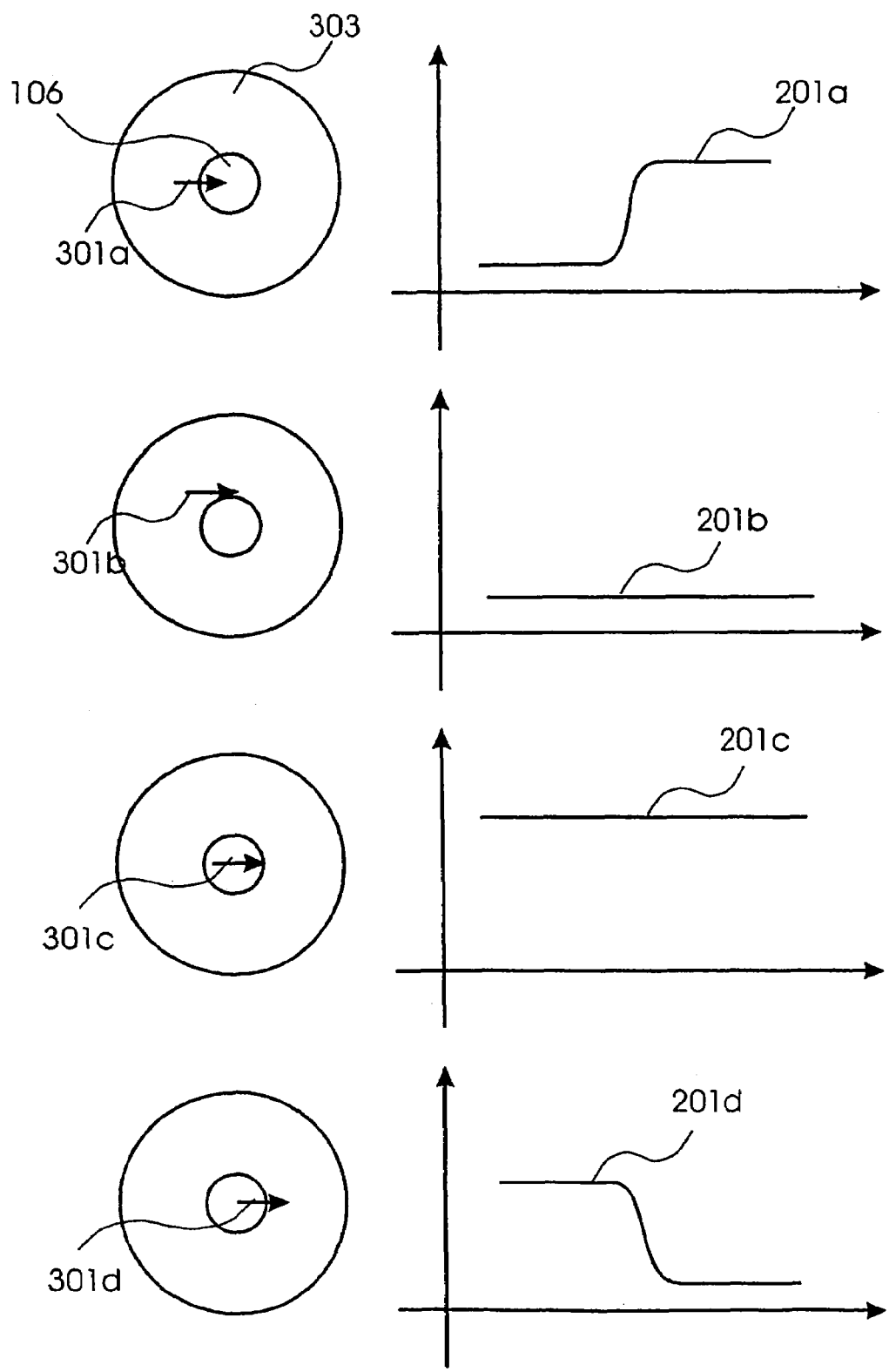
FIG. 3 shows some of the principle possibilities of a beam deflection during the gun alignment and the corresponding gun alignment graphs.
Figure 4:
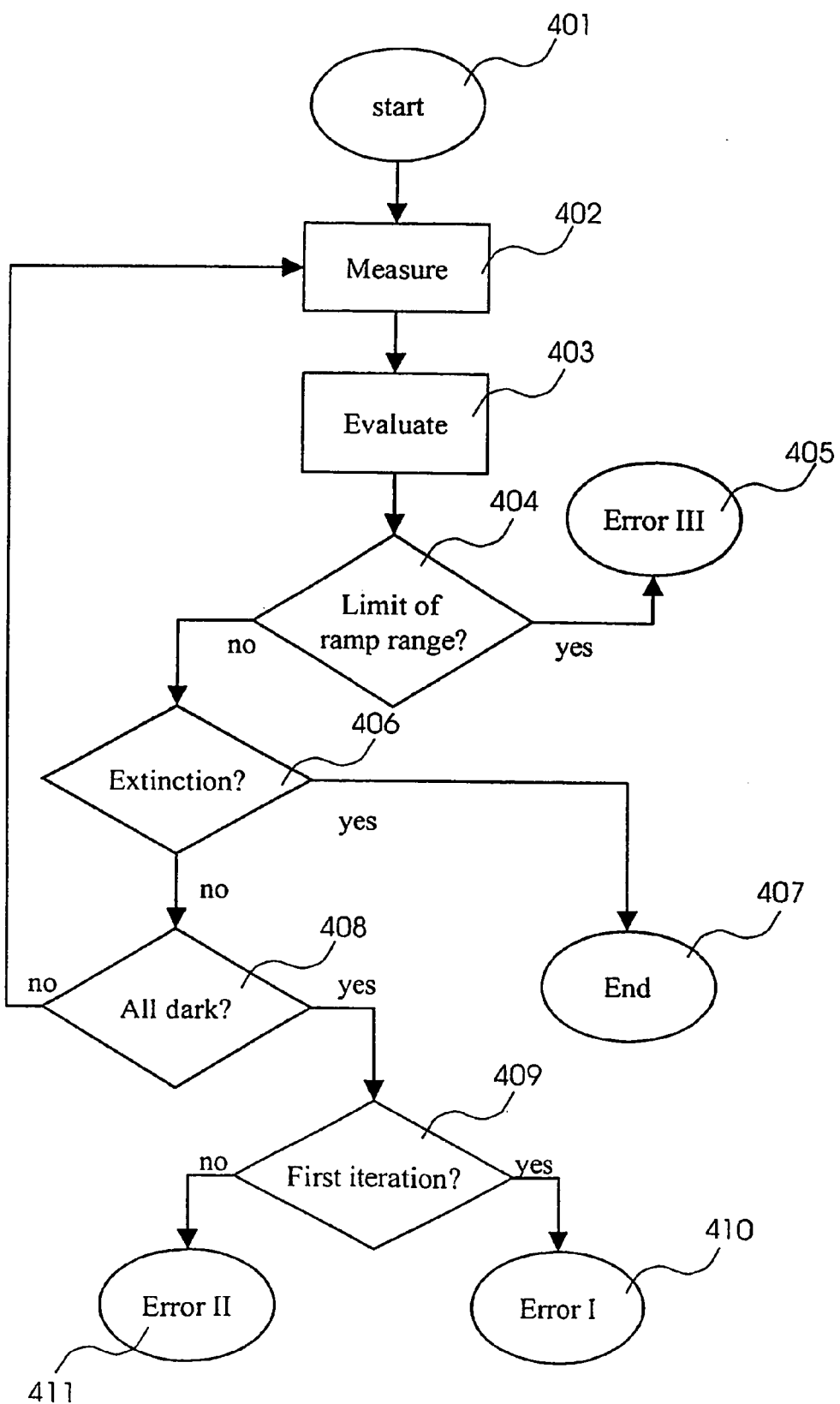
FIG. 4 shows a flow chart illustrating the process of gun alignment.

In FIG. 3 the beam deflection path 301 in the plane of the aperture is shown in form of an arrow. From the top down, the following situations are illustrated. Beam deflection path 301*a* starts outside the opening (the aperture) of the aperture plate 303. The beam is blanked. During the movement towards the center of the aperture 106, a transition to an unblanked beam occurs, as can be seen in gun alignment graph 201*a*. Beam deflection path 301*b* starts similar to beam deflection path 301*a*. However, the beam does not cross the edge of the aperture 106. Therefore, the gun alignment graph 201*b* has low brightness for all images measured. Beam deflection path 301*c* starts without having an extinction of the beam. The beam, however, is never blanked by the aperture plate 303 along its deflection path. Thus, the gun alignment graph 201*c* is bright for all reading points a frame is generated. Finally, beam deflection path 301*d* shows the deflecting option that is preferred according to the present invention. This can be seen, referring to FIG. 4, since this beam deflection path does not yield an error notification. Beam deflection path 301*d* starts at a beam position without extinction and ends at a beam position in which the electron beam 101 is blanked by the aperture plate 303. Gun alignment graph 201*d* shows the corresponding functional behavior from a high brightness via a transition to a low brightness.

A flow chart taking into account the status notifications necessary for automation is shown in FIG. 4. The flow chart shows the necessary steps to conduct the deflection by means of the gun alignment deflection units in one direction. Thus, the flow chart is executed four times to measure two edges on respective sides in x-direction and two edges on respective sides in y-direction. In step 401, the procedure is started e.g. by a command given from an external computer or the like. In step 402 the measurements are conducted. Thereby, several frames are generated and e.g. sent to a frame, while the first and second gun alignment deflection units are operated to produce continuously changing deflection fields. Thus, in step 403 the individual frames can be evaluated by calculating the gray levels of the frames each corresponding to a deflection field strength. Thereby, a gun alignment graph as seen in FIG. 2*b* or in FIG. 3. will be obtained. In the case that during the measurement the variation of the deflection field, preferably in form of a ramp, reaches a limit, that is to say no further deflection can be reached even though the ramp requested by a controller will continue, in step 405, Error III is sent to the host controller. The respective decision step 404 otherwise continues to the further decision step 406. If an extinction has been reached, that is to say that a transition from a bright gray level to a dark gray level, the procedures ends at step 407. Otherwise it is checked in decision step 408, if all images were dark. If this is not the case (thus "no extinction" and "not all images dark"), a further ramp continuing the last ramp is calculated by a controller and the electron microscope 100 would continue to step 402 to measure with this further deflection commands of a controller. In case decision step 408 continues with "yes" it is in a further decision step 409 decided whether this was the first iteration, namely if the procedure already had a progression from step 408 to 402 or not. In case of the first iteration the conditions were according to gun alignment graph 201*b* in FIG. 3 and Error I is sent a controller in step 410. Thus the preferred preliminary condition to start with no extinction is not met. In case further iteration steps have been conducted before, Error II is sent in step 411. Error II announces that an extinction occurred but was not identified by the system.

Independent of specific embodiments, it is advantageous that the ramp form of the deflection fields is defined by an initial value and an amplitude. Thereby, a resolution can be defined that is a function of a total number of frames measured during one ramp cycle and/or the amplitude of the ramp. In view of this aspect, it is more preferred to allow the measurement of at least one further ramp, whereby the strength of the deflection fields of the successive ramps overlap. Thus, a simplified process flow can be achieved in case of an error notification that the deflection field corresponding to the first ramp did not deflect the beam across the edge of the aperture. This will lead additionally to a shortened alignment time compared to other process flows and will thus improve the aligning method.

A further embodiment to align electron beam 101 with the electron microscope 100 shown in FIG. 1 is described with respect to FIGS. 5*a*, 5*b*, 6, 7*a* and 7*b*. Objective lens 112 focuses the electron beam 101 on the specimen. Electron beam 101 has previously been formed by apertures and condensor lenses. Since objective lens 112 is mainly responsible to achieve the final spot size, which limits the resolution, the beam has to be accurately aligned to the objective lens. In general, the objective lens defines an optical axis.

After the beam has been aligned to the aperture 106, as described above, it is usually not yet aligned to this optical axis 113 defined by the objective lens 112.

Figure 5A:
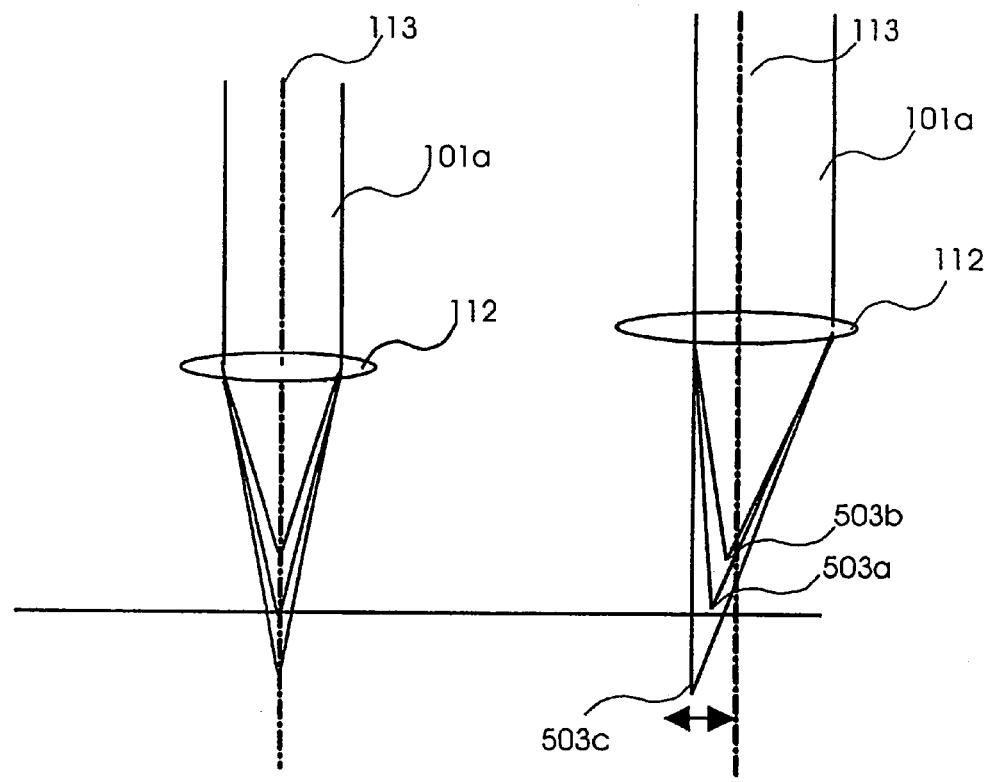
FIGS. 5a and 5b show the principle of aperture alignment; it is illustrated how a misaligned beam introduces a translation of the generated image.
Figure 5B:
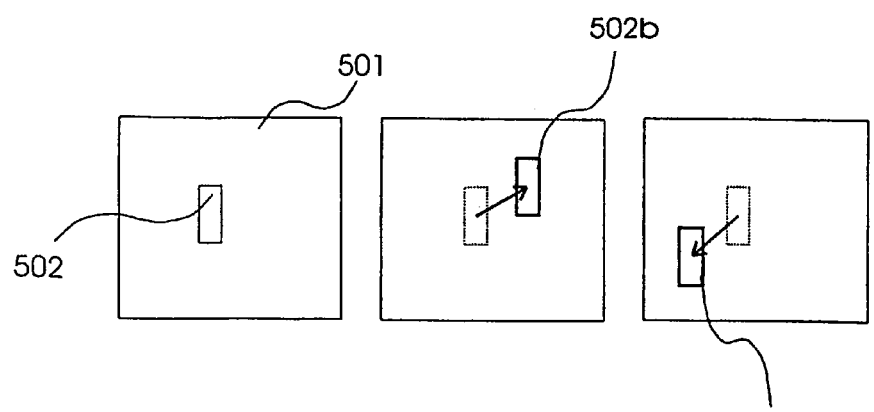

The principle, whether or not the beam is accurately aligned can be better understood with respect to FIG. 5*a*. On the left side, an electron beam 101*a* is outlined, that is symmetrically aligned with respect to optical axis 113. In case a defocusing is purposely induced, the focus moves in perpendicular direction to the plane of a specimen. The respective image impression obtained, if measurements are conducted during a periodical defocusing, referred to as wobbling, will be the following. A feature of an image will periodically be pictured in focus and out of focus. However, the image will not be translated, since the focus of electron beam 101*a* only varies in a direction perpendicular to the specimen surface. Only a periodical blurring of the image or corresponding image features will be experienced.

On the other hand, if the beam is not well aligned as shown for electron beam 101*b* on the right hand side of FIG. 5*a*, the focus does not only move in a direction perpendicular to a specimen surface but also in a further direction parallel to the surface. Thus, for successive images, additional to the blurring of the image or features, also a translation/shift of the image will be experienced. This is further illustrated in FIG. 5*b*. A well-focused image feature 502 within the field of view 501 corresponds to the focus condition 503*b* in FIG. 5*a*. If a defocusing to the focus 503*b* is realized, the image feature shifts with respect to the field of view and blurs due to the defocusing. Thus, an image feature will be seen similar to e.g. 502*b*. On the other hand, for a focus according to 503*c* the image feature is translated in the opposite direction as illustrated for 502*c*. Again, this translation is obtained in addition to a blurring.

First aperture alignment deflection unit 110, however, does not shift the beam towards the optical axis 113, but deflects the beam whereby a beam tilt is introduced. That is to say, the angle of the beam with respect to e.g. an optical axis changes due to the deflection. This beam deflection is, at least partially, compensated for by the second aperture alignment deflection unit 111. Preferably, second aperture alignment deflection unit 111 tilts the beam at the same angle as the first gun alignment deflection unit in the opposite direction. This can e.g. be realized-by having two similar deflection units and connecting them electrically in a manner that the deflection fields with the same absolute value have the opposite direction. However, the present invention is not limited to similar first and second aperture alignment deflection units 110 and 111. Differences in deflection angles for identical signals applied to the deflection units could also be equalized by correction factors or the like.

According to the present invention, it is advantageous to realize a periodical focusing due to the variation of energy of the electron beam 101 and the chromatic aberrations introduced within the objective lens thereby. This is advantageous over a defocusing using the objective lens current. Thereby, the frequency of the periodic variation of the focus is not limited by self-inductance within the lens. Further, no hysteresis within the objective lens can occur.

Figure 6:
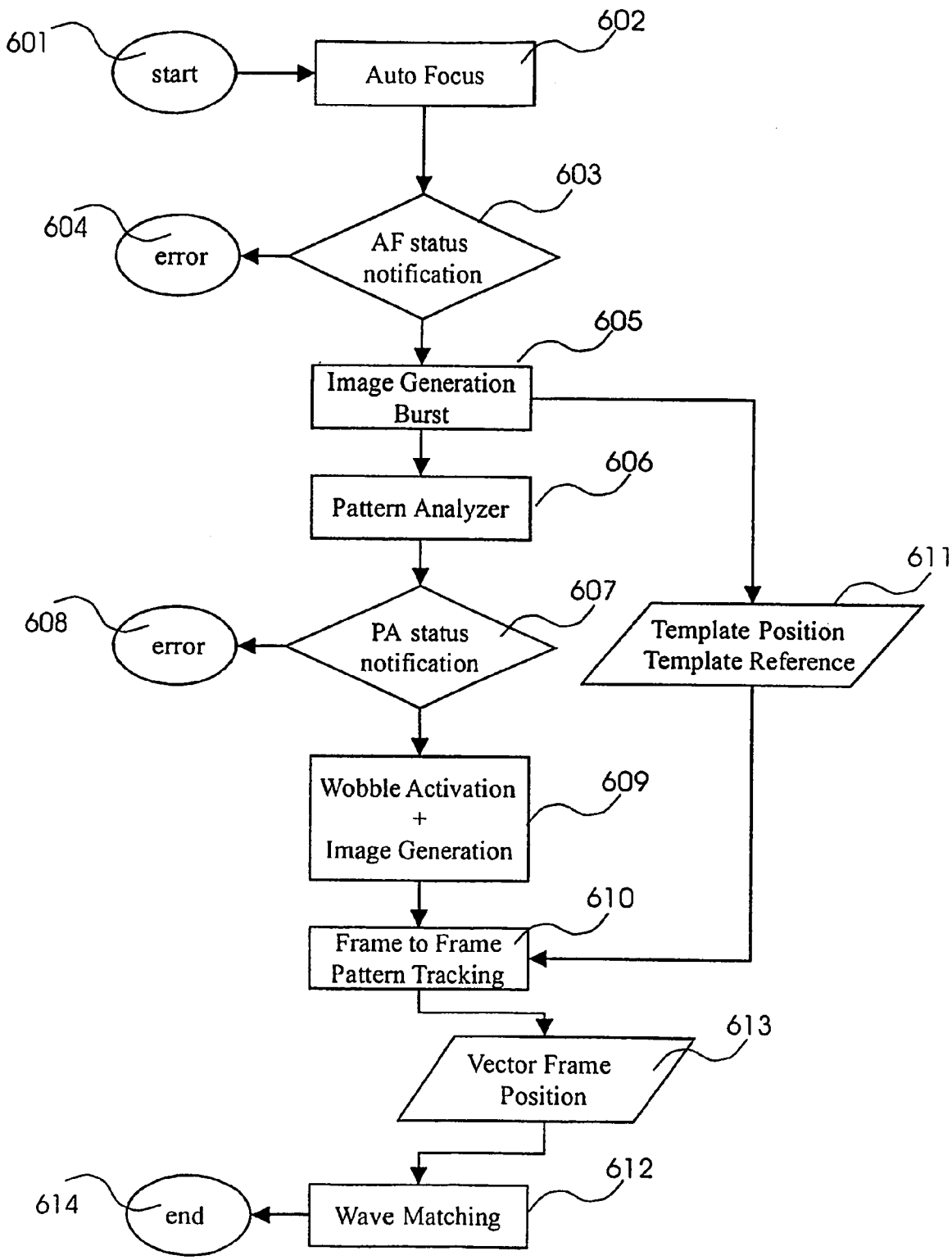
FIG. 6 shows a flow chart of the process of aperture alignment.

An example, for an automated procedure is, in the following, described with respect to FIG. 6. A master controller or the like initiates in step 601 the start of the alignment operation. First, in step 602 the autofocus is activated. Thereby, the focus is set on the surface of a specimen. Thus, the image quality can, in general, however limited by the current alignment condition, be improved. The autofocus returns a failure or success status, which is decided upon in decision step 603. In case of a failure notification (step 604), major problems in the imaging conditions of the SEM can be expected and the alignment procedure is quit with an error message. In case of a success notification, the alignment process continues with step 605.

Generally said, the additional step of adjusting the focus of the beam of charged particles is advantageously added. Thereby, it is preferred to evaluate the result of this focusing step. That is to say, based on the result of a status notification, it can be judged whether or not the device alignment conditions are sufficient to further proceed with the automatic alignment. Thus, e.g. a failure status of the focusing procedure can be used to warn an operator in advance that the apparatus conditions might be insufficient for an automatic adjustment. This again, can avoid a waste of time in case the system is totally misaligned.

In step 605 preferably a high quality image is generated. Thereby, a reference image is generated using e.g. averaging of several frames and thereby improving the signal to noise ratio. Additionally, further methods to improve the image quality can be applied. This could be filtering methods or any other suitable method. This high quality image, the burst image, is used in step 606 for the pattern analyzer. In step 606, the image is analyzed with respect to patterns having e.g. the necessary contrast to be used as a reference image feature. The pattern analyzer determines the position and the orientation of a so-called golden template. This position of the golden template and the golden template itself is used as an input for the pattern tracking described below and is provided to the pattern tracking via step 611. In case no golden image could be found by the pattern analyzer that meets conditions like sufficient contrast, suitable orientation or suitable brightness, an error notification is sent to the master controller. The master controller, is in step 608, thereby informed that the current field of view detected on the wafer is not appropriate for the alignment process. The master controller could, based on this notification, e.g. move a stage where the specimen is mounted on and start the procedure over. Thus due to the decision step 607, it can be verified that a specimen location suitable for the alignment process is imaged.

In step 609, the wobble, that is to say the periodic defocusing introducing the image shift, and the image generation is activated. Thereby, a sequence of frames are generated and grabbed by the image processor. The energy of the beam of charged particles or any potential influencing the beam energy is preferably changed in a sinusoidal manner. Preferably, the imaging is conducted for a time larger than the period for one wobble oscillation. For example, 32 frames are grabbed during 1.5 oscillations of the periodical wobbling.

In step 610, the pattern-tracking algorithm receives the 32 images (frames), the golden template and its position. The pattern tracking routine has to follow the translations of the reference image features introduced due to the vertical movement of the focus in spite of the blurring. Thereby, it also possible that more than one image feature within the field of view is used as a reference. Preferably, the pattern-tracking algorithm first compares the golden template to all of the 32 frames and finds the frame that is closest to the golden image. This frame that is closest to the golden image is referred to as initial frame. In additional, to finding this frame, the respective frame index is also found. Such a procedure has the advantage that there is less necessity to control the synchronization of activating the wobble and activating the image generation. Ideally the initial frame would be similar to the burst image, as if the wobble would be switched off. In case of a sufficient high image generation frequency, the initial frame is very similar to the burst image. The fact that only a small part of the image, the individual frame respectively are compared, namely the golden template, leads to a decrease of the time used for evaluation.

In general, the pattern recognition can be conducted using one of several possibilities like correlation scores to template images, classification, neural networks or other pattern recognition routines.

Since there is only a small image shift of successive frames, it is preferred to use a recursive pattern tracking. Thereby, the initial frame having an index k is compared to the next frame with index k+1. The missregistration between two successive frames of the sequence of frames is, thus, limited to a view pixels, preferably smaller than 10 pixels. The vector, having x and y components pointing from the template position in frame k to the position of the respective image feature in frame k+1 is recorded. The next recursion is conducted using frame k+1 as a template. Each template of each frame, after it has been identified, is compared to the golden template. In case of a bad correlation beyond a certain threshold, the frame is designated invalid. Thus, inaccurate images, e.g. due to too much blurring, are not taken into account for the evaluation.

The vector for the miss-registration is, in step 610, finally converted to a frame position vector, which is sent in step 613 to a wave matching routine in step 612.

Within step 612, the observed periodic phenomena and the induced periodic variation are fitted to each other. Thereby, the period of the wobble generation and the observed phenomena are identical. Using the time t and the wobble period T, the Energy can be expressed as:

$$E(t) = E_0 + A_{Wobble} \cdot \cos\left(\frac{2\pi}{T}t + \Phi\right)$$

Thereby, $\Phi$ is an arbitrary phase. In order to have an equivalent expression for the discrete frames imaged, the frame index I and the number of frames N generated within one wobble period can be used, whereby the following expression is obtained:

$$E(i) = E_0 + A_{Wobble} \cdot \cos\left(\frac{2\pi}{N}i + \Phi\right)$$

The index vector position is a measure of the position of the target pattern for each frame. Thereby, a projection on the x and y, labeled Px and Py, axis can be separately looked at. Assuming a Px and Py being a sinusoidal wave as well, e.g. Px can be expressed as $$P_x(i) = A_x \cdot \cos\left(\frac{2\pi}{N}i + \Phi\right) + C_x$$

From a discrete Fourier transform the following expressions can be obtained:

$$A_x = \frac{2}{N\cos(\Phi)} \sum_{i=1}^{N} P_x(i) \cdot \cos\left(\frac{2\pi}{N}i\right)$$

and $$A_x = -\frac{2}{N\sin(\Phi)} \sum_{i=1}^{N} P_x(i) \cdot \sin\left(\frac{2\pi}{N}i\right)$$

Therefrom the parameters Ax (=$A_x$), $\Phi$ and Cx (=$C_x$) can be calculated as follows.

$$Ax^2 = \frac{4}{N^2}\left[\left(\sum_{i=1}^{N} P_x(i) * \cos\left(\frac{2\pi}{N}*i\right)\right)^2 + \left(\sum_{i=1}^{N} P_x(i) * \sin\left(\frac{2\pi}{N}*i\right)\right)^2\right]$$

$$\tan(\Phi) = -\frac{\left(\sum_{i=1}^{N} P_x(i) * \sin\left(\frac{2\pi}{N}*i\right)\right)}{\left(\sum_{i=1}^{N} P_x(i) * \cos\left(\frac{2\pi}{N}*i\right)\right)}$$

$$Cx = \frac{1}{N}\sum_{i=1}^{N} P_x(i)$$

These parameters are used as initial values for a second fitting method. Thereby, preferably only the valid frames are taken into account and the mean square fitting operation minimizes the following expression by finding Ax, $\Phi$ and Cx:

$$\sum_{i=ValidFrame}^{N} \left[P_x(i) - A_x\cos\left(\frac{2\cdot\pi}{N}\cdot i + \Phi\right) + C_x\right]^2$$

Figure 7A:
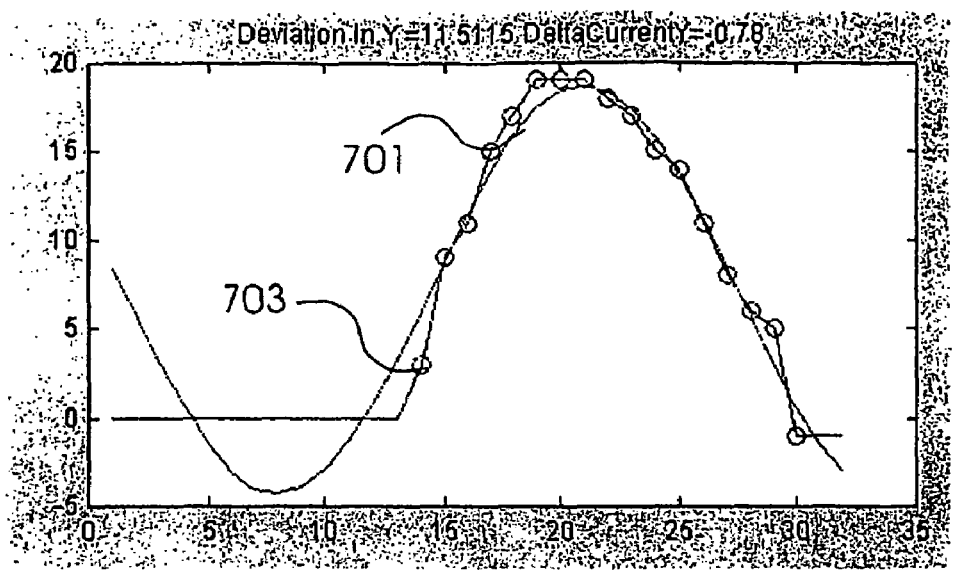
FIGS. 7a and 7b illustrate wave matching curve fits of the measured translation vectors.
Figure 7B:
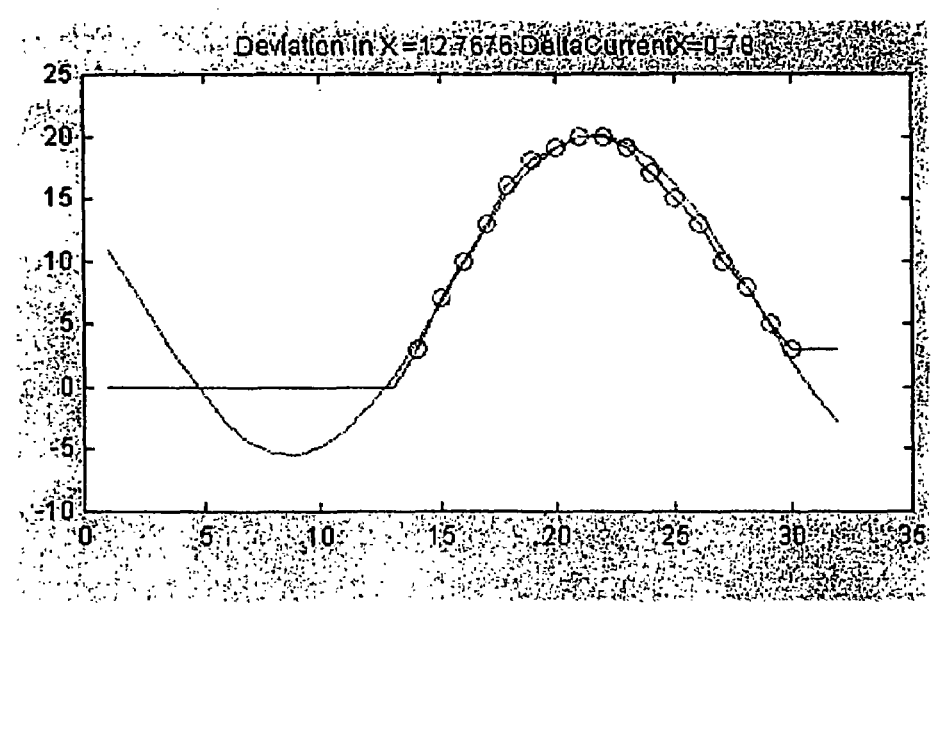

Respective results can be seen in FIG. 7a for the x-direction and in FIG. 7b for the y-direction. Graph 703 shows the measured frame positions including the valid frames marked as circles. These valid frames are used for the mean square fitting. Graph 701 shows the sinusoidal function fitted to the measurements. The respective signal that has to be introduced in the aperture alignment deflection units 110, 111 can be calculated from the amplitude. Both values are given on top of each of the FIGS. 7a and 7b. Thereby, a calibration is used that has been conducted before. From the calibration the functional behavior of $\Delta I=f(\Delta x/\Delta V_{acc})$ is known, whereby I is a current that has to be applied to a deflection coil, x is the translation of the image and $V_{acc}$ is the acceleration voltage that changes the energy of the beam. Such a calibration can be conducted once during manufacturing of the column or can be conducted on a regular basis. Preferably a set of calibrations for different system parameters is available. The calibration function can be any polynomial function; preferably a linear calibration function is used.

A further embodiment will be described in more detail with respect to FIGS. 8 to 11b. Besides the gun alignment and the aperture alignment it is further preferably to correct for astigmatism of the objective lens in order to improve the image quality achievable with the charged particle column. Within the description of astigmatism the usage of the wording x- or y-direction does not necessarily imply that the two directions are orthogonal to each other. Yet, it is preferred to refer to x- and y-direction as being rotated to each other by 45° if referring to the correction of the astigmatism.

Figure 8:
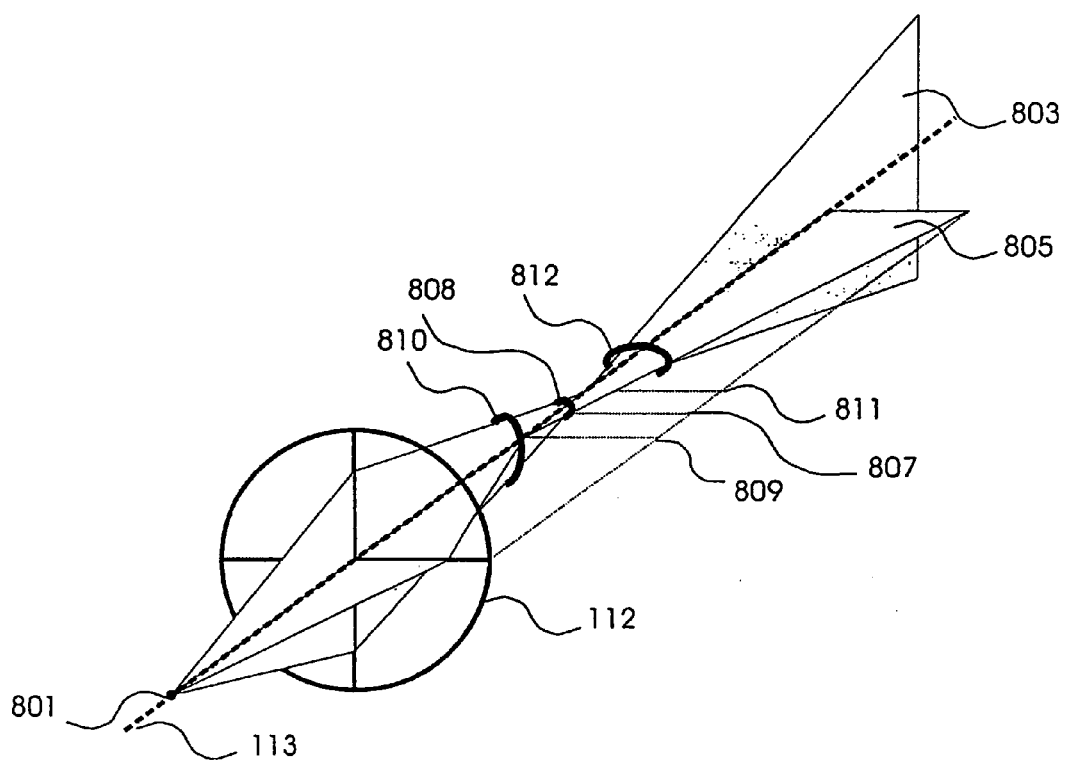
FIG. 8 illustrates the principle of astigmatism.

Astigmatism can be described referring to FIG. 8. In the case of astigmatism occurring, a punctual object 801 is not ideally imaged since the focus 809 in the first image plane 803 is not identical to the focus 811 in the second image plane 805. Thus, if the point of best focus 807 is to be found, a compromise has to be found. For this reason, the image 808 at the point of best focus has an enlarged diameter. In case of a defocusing, the image of a punctual image will not be circular anymore, but will be elliptical. The orientation of the ellipse depends on whether an image plane will be located before or behind the point of best focus 807. In addition, if the image is out of focus, the resolution in the two directions defined by the first and second image plane will be different from each other.

Within an electron beam apparatus the distortion of the beam is corrected by a stigmator. This is preferably done every time any alignment has been conducted, since the stigmatism changes dependent on the alignment of the electron beam 101 within the electron beam column. The distortion in x-direction is thereby corrected for due to the set of coils 902. The set of coils is preferably arranged in form of a quadrupole. In general, coils are used to form the quadrupole. However, also a combination of coils and electrostatic plates can be used. In order to correct in a direction independent to the x-direction preferably a second quadrupole arrangement as a set of coils 903 is used. Thus, a beam distortion can be corrected for, in each direction, by the octupole arrangement formed thereby. However, it is also possible to only use a quadrupole stigmator, which can be rotated to be adjusted to the respective orientation of the distortion of the beam 101.

Figure 9:
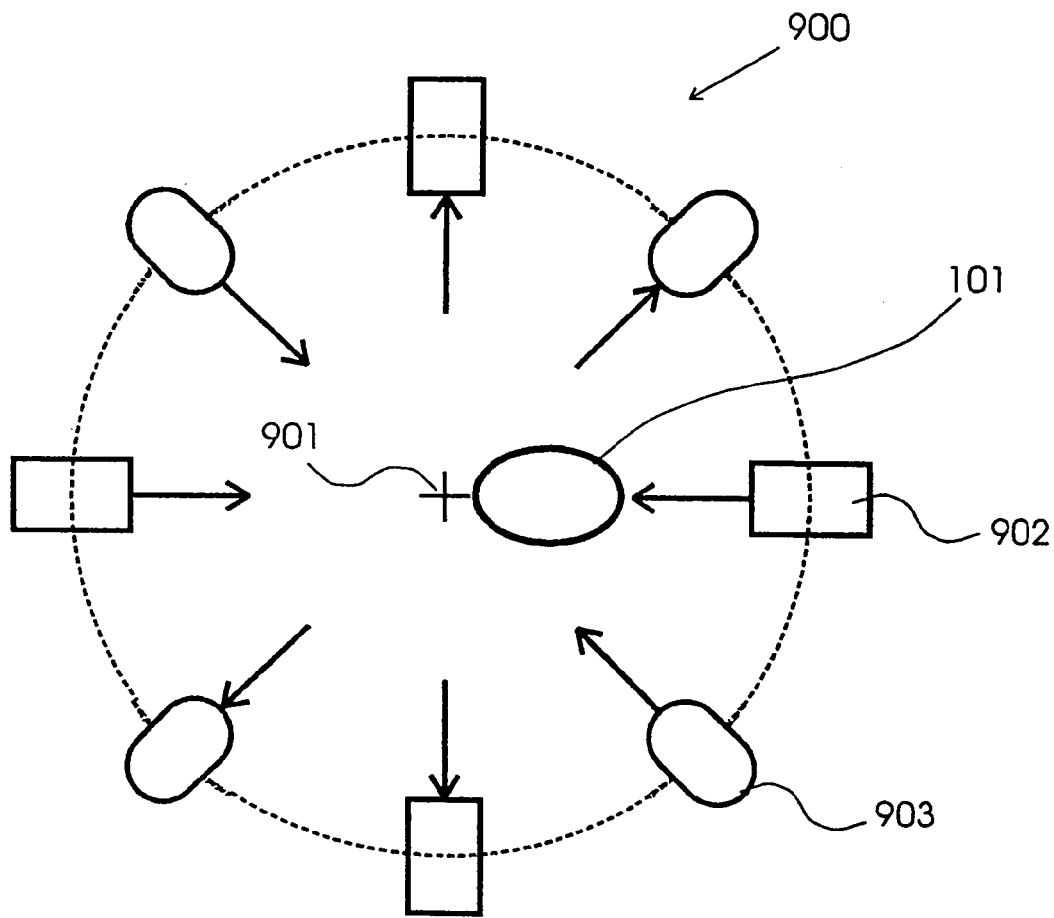
FIG. 9 shows a block diagram of two quadrupole stigmators for two directions combined to an octupole stigmator.
Figure 10:
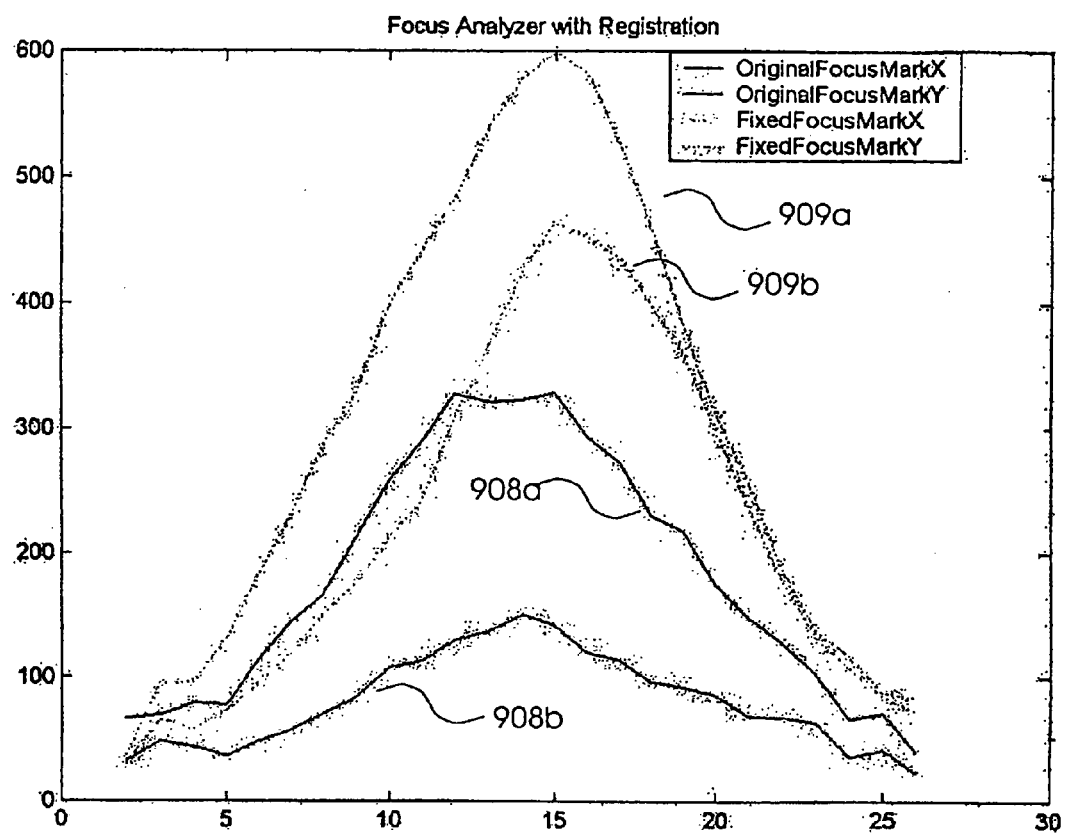
FIG. 10 shows experimental results of focus marks and the improvement achievable due to corrections.

As shown in FIG. 9, the beam does not necessarily pass through the center 901 of the stigmator. Further, if currents are applied to the coils, electrical fields are also generated driving a shift of the electron beam 101. The implication therefrom will be referred to below.

To correct for astigmatism, preferably a feature that is small enough to be entirely within the field of view is imaged. The feature should preferably show edges to obtain an image contrast in several independent directions. This could e.g. be a circular feature or the like which position is known within the field of view. In order to automatically correct for astigmatism, the following procedure is performed. First, the field of view is set and the feature is located. Then, the image is automatically focused varying the beam energy and thereby introducing chromatic aberrations. After the automatic focus has succeeded, the current in the first set of stigmator coils 902 is varied, whereby several images are generated. The sharpness of the images is evaluated by calculating a focus mark and the current in the first set of stigmation coils 902 is set to the value that had the best focus mark. The focus mark is a measure for the sharpness of an image. Afterwards, the procedure is repeated for the second set of stigmator coils 903. For a second iteration the field of view is reduced and the scan direction is rotated, preferably by 45°. After a fine shift of the image to locate the respective feature, the procedure of autofocus and correction for both stigmators are repeated. A third, optional iteration can be conducted analogous to the second iteration with a further reduction of the field of view and a further rotation of the scan direction.

As mentioned above, a variation of the currents in the first and second set of coils for the stigmator in x- and y-correction also drives a shift of the image. One possible solution to evaluate the sharpness by calculating the focus mark is to observe the covariance of two consecutive frames. A shift of the images within the field of view will, however, influence the covariance. For this reason, the shift of the image can only be ignored of it is small, e.g. limited two 2 or 3 pixels or the like. Thus, for image shifts beyond this, the evaluation of the sharpness has do be conducted using improved methods.

According to a further embodiment of the present invention the following procedure is conducted. First, the field of view is set and the feature is located. Then, the image is automatically focused. After the automatic focus has succeeded, the current in the first set of stigmator coils 902 is varied, whereby several images are generated. The sharpness of the images is evaluated by calculating the focus mark as described below and the current in the first set of stigmation coils 902 is set to the value that had the best focus mark. Afterwards, the procedure is repeated for the second set of stigmator coils 903. For a second iteration, the field of view is reduced and the scan direction is rotated, preferably by 45°. After a fine shift of the image to locate the respective feature, the procedure of autofocus and correction for both stigmators are repeated. A third, optional iteration can be conducted analogous to the second iteration with a further reduction of the field of view and a further rotation of the scan direction.

Thereby, the focus mark is calculated whereby the shift of the image is recorded similar to the measurement of the beam shift applied to the aperture alignment. Thereby, one of various pattern recognition routines can be used. After the image shift has been corrected for, the correlation of consecutive frames can be calculated. Due to the correction, the focus mark diagram can be improved, namely there will be more measurement above a certain noise level and thus the accuracy and repeatability of finding the sharpest image will be improved. This can be seen comparing the original focus mark graphs 908a and 908b and the fixed focus mark graphs 909a and 909b in FIG. 10.

According to a further embodiment of the present invention, the following procedure is conducted. First, the field of view is set and the feature is located. Then, the image is automatically focused. After the automatic focus has succeeded the current in the first set of stigmator coils 902 is varied, whereby several images are generated. The sharpness of the images is evaluated by calculating the focus mark as described below and the current in the first set of stigmation coils 902 is set to the value that had the best focus mark. Afterwards, the procedure is repeated for the second set of stigmator coils 903. For a second iteration the field of view is reduced and the scan direction is rotated, preferably by 45°. After a fine shift of the image to locate the respective feature, the procedure of autofocus and correction for both stigmators are repeated. A third optional iteration can be conducted analogous to the second iteration with a further reduction of the field of view and a further rotation of the scan direction.

Thereby, the focus mark is calculated using a gray level histogram. Thereby, the entire image is used for an evaluation. The evaluation is based on the analysis of the amount of high contrast gradients within the image. It is assumed that the sharper the image is the higher the amount of edges having a certain contrast gradient is, since there is less blurring. Further, it is assumed that there is, in case of a better sharpness, a better separation between the noise and the edges of the imaged features in a gray level histogram of the first derivative. Since this method is independent of the position of a feature within the image, there is hardly any dependency on the image shift. In the case that the edges on the specimen are uniformly distributed in the area of the field of view and around the field of view, there is no dependency on the image shift at all, since a movement of the field of view does not change the number of edges that could possibly be imaged.

The gray level histogram can be calculated e.g. from a composed directional derivatives $$S(i, j) = \sqrt{S_x^2(i, j) + S_y^2(i, j)}$$

whereby the Focus mark is calculated according to $$F_{j=FrameIndex} = \sum_{i=k}^{max} i^2 h_i$$

with k given as a certain percentage $\alpha$ of the gray level. Term $h_i$ is the histogram value given as the number of pixel at gray level i divided by the total number of pixels. If the individual frames are normalized with respect to the gray level distribution, the frames can preferably be evaluated independently of each other.

In a further embodiment according to the present invention, the following procedure is conducted. First, the field of view is set and the feature is located. Then, the image is automatically focused. After the automatic focus has succeeded, the current in the first set of stigmator coils 902 is varied, whereby several images are generated. The sharpness of the images is evaluated by calculating the focus mark as described below and the current in the first set of stigmation coils 902 is set to the value that had the best focus mark. Afterwards, the procedure is repeated for the second set of stigmator coils 903. For a second iteration, the field of view is reduced and the scan direction is rotated, preferably by 45°. After a fine shift of the image to locate the respective feature, the procedure of autofocus and correction for both stigmators are repeated. A third optional iteration can be conducted analogous to the second iteration with a further reduction of the field of view and a further rotation of the scan direction.

Figure 11A:
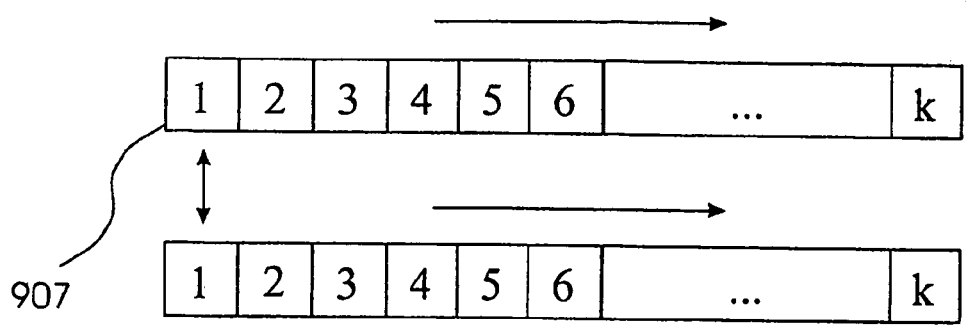
FIGS. 11a and 11b illustrate the principle of a two-ramp analysis for evaluating the sharpness of images.
Figure 11B:
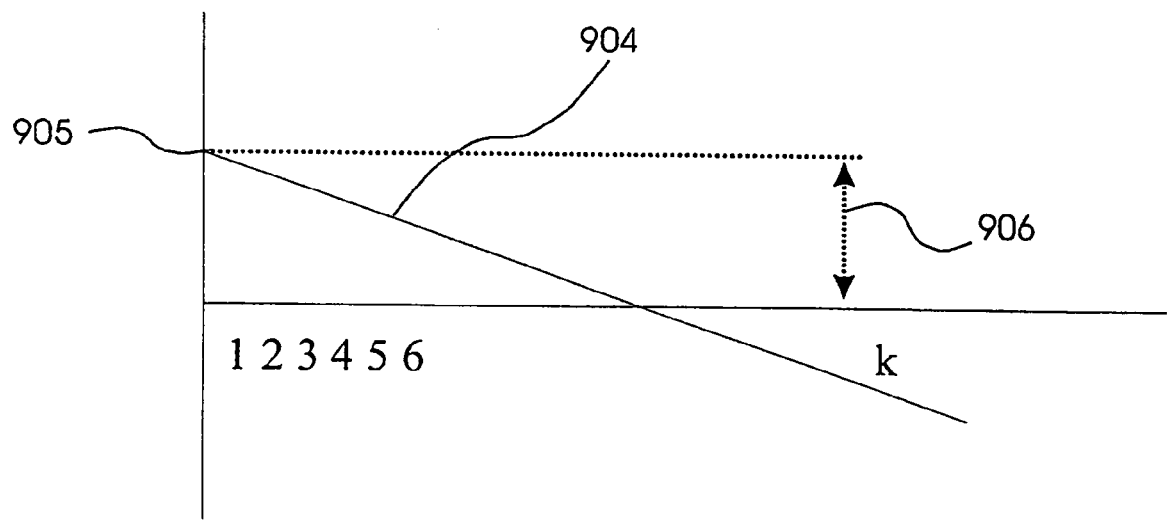

Thereby, the influence of the image shift due to the change of the currents in the stigmators is compensated during the sharpness evaluation as follows. Two ramps 904 of stigmator currents, as shown in FIG. 11b, are generated. Frames 907 generated, as shown in FIG. 11a, are generated under conditions being similar to each other. Thus, it is possible to calculate the correlation between the respective frames having similar conditions. For these two frames, there will be no shift or hardly any shift with respect to each other that has to be corrected for. The frames compared are not consecutive. The frames compared are equivalent frames from the respective ramps. Thus, the problem of the translation of individual features that are to be analyzed can be overcome. Preferably the signal to noise ratio can further be improved by accumulating more frames or using more than two ramps. It is further considered advantageous if a ramp is defined by its initial value 905 and its amplitude 906. Thus, two ramps can easily be combined in an overlapping manner if one of the ramps is not sufficient to find a maximum within the focus mark. Using the analysis of a pair of frames from two ramps 904 or a set if frames the focus mark can, for the above reason, significantly be improved.

In a further embodiment of the present invention, the concept of comparing frames taken under similar conditions is further extended. After the field of view is set and the feature is located, the image is automatically focused. After the automatic focus has succeeded, the current in the first set of stigmator coils 902 is varied, whereby several images are generated. The sharpness of the images is evaluated by calculating the focus mark as described below and the current in the first set of stigmation coils 902 is set to the value that had the best focus mark. Afterwards, the procedure is repeated for the second set of stigmator coils 903. For a second iteration, the field of view is reduced and the scan direction is rotated, preferably by 45°. After a fine shift of the image to locate the respective feature, the procedure of autofocus and correction for both stigmators are repeated. A third optional iteration can be conducted analogous to the second iteration with a further reduction of the field of view and a further rotation of the scan direction.

The extended comparison of frames will be described with respect to FIGS. 12a and 12b. In this embodiment, the ramp 904 applied to the stigmators is a step-like function. Instead of taking similar frames in separate ramps two or more frames 907 are generated within one step of the step-like ramp. In order to have conditions as similar as possible for each step of the ramp 904 a relaxation time has to be taken into account. This relaxation time is indicted in FIG. 12b having round edges compared to the angular steps sketched with dotted lines.

Figure 12A:
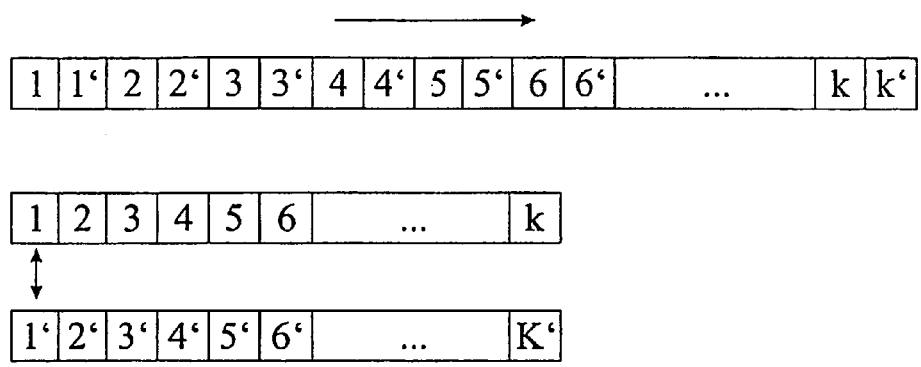
FIGS. 12a and 12b illustrate an extended principle of the two-ramp analysis, whereby two corresponding frames are generated during one ramp.
Figure 12B:
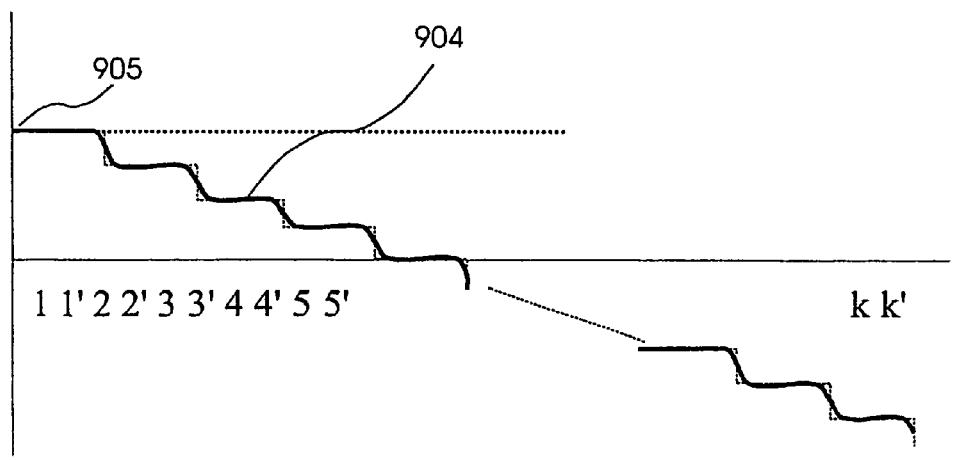

As shown in FIG. 12a, this embodiment can be realized as follows. At each level of the stigmator current two frames 907 are generated and passed to a frame grabber. After finishing the ramp, odd and even frames 1 and 1', 2 and 2' and so on are used to calculate the focus mark for each level of the stigmator current ramp. Thereby the covariance between each two respective frames as well as the noise level of the frames are calculated. The focus mark is calculated according to the following equations:

$$F_{u,k} = \text{COVARIANCE}\left(\frac{\partial I_k}{\partial u}, \frac{\partial I'_k}{\partial u}\right)$$

$$= \text{COVARIANCE}(S_{u,k}, S'_{u,k})$$

$$= \text{Mean}(S_{u,k} * S'_{u,k}) - \text{Mean}(S_{u,k})\text{Mean}(S'_{u,k})$$

$$\cong \text{Mean}(S_{u,k} * S'_{u,k}) \quad (\Leftarrow \text{mean}(S) \approx 0)$$

$$= \frac{1}{N_x N_y} \sum_{i,j}^{IMG} (S_{u,k}(i, j) * S'_{u,k}(i, j))$$

$I_k$ and $I'_k$ are the corresponding images and $N_x$ and $N_y$ are the total number of pixels in the respective directions.

Generally, such a procedure according to the following is considered preferable. During the focusing step, preferably automated, conducted within this aspect of the invention, a image processing unit or the like can evaluate the result of the image. This focus mark can be used as a measure to have a process judge whether the focusing yields a good or a poor result compared to an average system performance. Thus, based on the focus mark it is preferred to have the system decide whether a refreshing or a tuning of the charged particle apparatus shall be conducted. During a refreshing, the old system parameters are used as starting values wherefrom e.g. the stigmator currents are varied. In case the evaluation of the focus mark would indicate a poor result a tuning of e.g. the stigmator currents starting from default values would be preferably conducted. Thereby, e.g. system values can be used as a starting point for the variation of the stigmators. Therefore, it is even more preferred to divide the system performance in-different working zones. Thus, based on the focus mark results, the further proceeding can be chosen depending on the working zone achieved.

In view of the above general aspect, a further embodiment of the present invention, the evaluation result of a focusing step conducted before the stigmator currents are varied is used according to the following. Based on the focus mark generated by an automatic focusing, it is decided whether the astigmatism correction has to be refreshed or tuned. However, a decision thereon could also be made manually by an operator. In the case of a refreshing, the current values detected to be best during the last alignment or correction, are used as starting values. The amplitude of a ramp 904 is small compared to an amplitude used for tuning. For the tuning, the system is reset to its original parameters and the alignment or correction respectively is started from scratch. Thus, a larger amplitude for the ramp is used and a more accurate but also more time consuming alignment or correction respectively is conducted. Thereby, for an accurate system setup e.g. the number of edges within the field of view are taken into account. Based on the evaluation thereof, namely the fact if the field of view could be decreased and still having a sufficient number of edges with in the field of view, the specimen of the location on the specimen is rejected by the system. Within an error handling process, an operator is asked to change the specimen or the specimen location respectively.

In a further embodiment of the present invention, the aspects of gun alignment, aperture alignment and correction of astigmatism are combined to a complete alignment if the electron beam device. Thereby, it is preferred to first align the beam with respect to the center of the aperture (gun alignment). Afterwards, the beam is aligned to the optical axis defined by the objective lens (aperture alignment). This aperture alignment is more critical with respect to the imaging behavior compared to the gun alignment. Thus, this alignment, as already described within several of the previous embodiments, has to be very accurate. Finally the astigmatism is corrected. Thus, a charged particle device can be automatically aligned from scratch as long as some basic conditions are fulfilled.

Advantageous features related e.g. to the ramp form of the variation of a signal applied to a deflection unit, the details of pattern recognition and pattern tracking, the usage and connection of two deflectors to obtain a beam shift rather than a beam tilt or the variation of a potential to change the focus of the beam of charged particles and mentioned with respect to one of the inventive method should not be understood as applicable for this aspect only but can, if transmittable, also be used for other inventive aspects.

The invention claimed is:

1. A method for automatically aligning a beam of charged particles with an aperture comprising:
   a) applying a first deflection field to a first gun alignment deflection unit until an extinction of the beam at a first edge of the aperture is obtained;
   b) measuring a first signal provided to the first gun alignment deflection unit required to obtain the extinction;
   c) applying a second deflection field to the first gun alignment deflection until a further extinction of the beam at a second edge of the aperture is obtained;
   d) measuring a second signal provided to the first gun alignment deflection unit required to obtain the further extinction;
   e) using the first and the second signal to calculate the center position of the beam with respect to the aperture; and
   f) providing a correction deflection field to the first gun alignment deflection unit to guide the beam of charged particles through the center position of the aperture.

2. The method according to claim 1, wherein the energy of the beam of charged particles is varied by a modulation of an acceleration voltage.

3. The method according to claim 2, wherein a set of frames for each variation in one of the first or second deflection fields is generated and based on gray levels of individual frames of the set of frames the first and second signal is obtained.

4. The method according to claim 3, wherein the first and second signals are evaluated using a threshold for the gray levels.

5. The method according to claim 3, wherein the first and second signals are evaluated using a curve fit to the distribution of the gray levels.

6. The method according to claim 1, wherein a further deflection field of a second gun alignment deflection positioned in direction of the beam of charged particles after the aperture is applied to redirect the beam of charged particles.

7. The method according to claim 6, wherein the angle of the beam with respect to the optical axis before the first deflection unit is re-established.

8. The method according to claim 3, wherein the first or second deflection fields are applied in the form of a ramp and the individual frames are generated during one ramp cycle.

9. The method according to claim 8, wherein the ramp of the first or second deflection field is synchronized with the generation of the frames.

10. The method according to claim 8, wherein the ramp of the first or second deflection field is measured at least twice and corresponding frames of the individual frames are averaged.

11. The method according to claim 8, wherein the ramp is defined by an initial value, an amplitude and a resolution of the variation in one of the first or second deflection fields.

12. The method according to claim 11, wherein the resolution of the variation in one of the first or second deflection fields is improved by defining the total number of frames.

13. The method according to claim 11, wherein the resolution of the variation in one of the first or second deflection fields is improved by defining the amplitude of the ramp.

14. The method according to claim 11, wherein more than one ramp with at least different initial values are used and a field strength of the deflection fields of the ramps overlap.

15. The method according to claim 1, wherein before a) to f) the following is conducted:
   h) applying a deflection field to the first gun alignment deflection unit such that the aperture does not blank the beam.

16. The method according to claim 1, wherein the alignment is conducted separately for a second direction.

17. A method for automatically aligning a beam of charged particles with an optical axis of a charged particle column, comprising:
   a) introducing a chromatic aberration by a variation of the energy of the beam of charged particles, whereby a defocusing is obtained b) measuring an image shift; and c) providing a signal to a first aperture alignment deflection unit to shift the beam according to the beam shift required.

18. The method according to claim 17, wherein the energy of the beam of charged particles is varied by a modulation of acceleration voltage.

19. The method according to claim 17, wherein the variation of the energy is periodical and a periodical defocusing is obtained.

20. The method according to claim 19, wherein the periodical defocusing has a frequency faster than 2 Hz, preferably faster than 10 Hz, more preferably faster than 100 Hz.

21. The method according to claim 17, wherein a signal is provided to a second aperture alignment unit to redirect the beam of charged particles.

22. The method according to claim 21, wherein the angle of the beam with respect to the optical axis before the first deflection unit is re-established.

23. The method according to claim 17, further comprising focusing the beam of charged particles on a specimen surface before conducting a) to c).

24. The method according to claim 17, wherein a high quality image is measured to obtain a golden template.

25. The method according to claim 17 to, wherein a sequence of frames are measured to obtain quasi-continuous image shifts.

26. The method according to claim 25, wherein the image shift between two successive frames of the sequence of frames is smaller than 5 pixels.

27. The method according to claim 25, wherein respective features of the sequence of frames are compared with the golden template.

28. The method according to claim 17, wherein the image shift is measured using pattern tracking.

29. The method according to claim 17, wherein the image shift is measured using a recursive pattern recognition.

30. The method according to claim 25, wherein an initial frame that is closest to the golden template is selected from the sequence of frames.

31. The method according to claim 25, wherein a frame position vector is calculated from the image shifts between successive frames.

32. The method according to claim 31, wherein the frame position vector is fitted to the variation of the energy of the beam of charged particles.

33. The method according to claim 17, wherein c) is based on a calibration of the image shift over the defocusing.

34. The method according to claim 17, wherein the alignment is performed faster than 0.5 s.

35. The method according to claim 17, wherein the automatically aligning is improved using at least one iteration.

36. The method according to claim 17, wherein the automatically aligning is conducted in a second direction.

37. The method according to claim 33, wherein the calibration is done for different setups.

38. A method for automatically aligning a beam of charged particle of a charged particle beam device comprising:

a) applying a first deflection field to a first gun alignment deflection unit to extinguish the beam of charged particles at a first edge of the aperture;

b) measuring a first signal provided to the first gun alignment deflection unit required to obtain the extinction;

c) applying a second deflection field to the first gun alignment deflection to have a further extinction of the beam at a second edge of the aperture;

d) measuring a second signal provided to the first gun alignment deflection unit required to obtain the further extinction;

e) using the first and the second signal to calculate the center position of the beam with respect to the aperture;

f) providing a correction deflection field to the first gun alignment deflection unit to guide the beam of charged particles through the center position of the aperture;

g) repeating a) to f) for a second direction using a second gun alignment deflection unit;

h) changing a focal position of the beam of charged particles with respect to a surface of a specimen;

i) measuring an image shift;

j) evaluating a beam shift required to align the beam of charged particles to the optical axis of the charged particle column based on the image;

k) focusing the beam of charged particles on a surface of a specimen;

l) varying the current in a first group of stigmation coils;

m) evaluating the sharpness of the images to find the current associated with the sharpest image and setting the current of the first group of stigmation coils to the current associated with the sharpest image; and n) repeating l) and m) for a second group of stigmation coils.

39. The method according to claim 38, wherein h) and k) is conducted by changing the energy of the charged particle beam.

40. The method according to claim 38, wherein h) to j) are conducted after a) to g) and k) to n) are conducted after h) to j).

41. A method according to claim 38, wherein step l comprises:

imaging a sequence of frames whilst varying the current in the first group of stigmation coils, and wherein step m comprises:

evaluating the sharpness of the sequence of frames.

42. The method according to claim 39, wherein the energy of the beam of charged particles is changed by a modulation of the acceleration voltage.

43. The method according to claim 41, wherein the currents are varied in the form of at least one ramp.

44. The method according to claim 38, wherein step m comprises:

finding the sharpest image by evaluating the gray level histogram of a first derivative.

45. The method according to claim 38, wherein step m comprises:

finding the sharpest image by using a two ramp focus analysis, whereby at least two frames having a similar condition are compared.

46. The method according to claim 45, wherein the at least two frames are compared calculating a covariance.

47. The method according to claim 45, wherein the at least two frames are measured during at least two ramp cycles.

48. The method according to claim 45, wherein the ramp has a step like form and the at least two frames are generated during one ramp cycle.

49. The method according to claim 38, further comprising the step of:

measuring an image shift using pattern recognition and correcting for the beam shift.

50. The method according to claim 38, further comprising the step of:

using a focus mark to evaluate whether a refreshing or a tuning has to be conducted.

51. The method according to claim 50, wherein different working zones are defined based on the focus mark.

52. The method according to claim 38, wherein the first or second deflection fields are applied in the form of a ramp and the individual frames are generated during one ramp cycle.

53. The method according to claim 52, wherein the ramp of the first or second deflection field is synchronized with the generation of the frames.

54. The method according to claim 52, wherein the ramp of the first or second deflection field is measured at least twice and corresponding frames of the individual frames are averaged.

55. The method according to claim 52, wherein the ramp is defined by an initial value, an amplitude and a resolution of the variation in one of the first or second deflection fields.

56. The method according to claim 55, wherein the resolution of the variation in one of the first or second deflection fields is improved by defining the total number of frames.

57. The method according to claim 55, wherein the resolution of the variation in one of the first or second deflection fields is improved by defining the amplitude of the ramp.

58. The method according to claim 55, wherein more than one ramp with at least different initial values are used and a field strength of the deflection fields of the ramps overlap.

59. The method according to claim 55, wherein before steps a) the following step is conducted:

applying a deflection field to the first gun alignment deflection unit such that the aperture does not blank the beam.

* * * * *